US012457815B2

(12) United States Patent
Katsuta et al.

(10) Patent No.: US 12,457,815 B2
(45) Date of Patent: Oct. 28, 2025

(54) DETECTION DEVICE

(71) Applicant: Magnolia White Corporation, Tokyo (JP)

(72) Inventors: Tadayoshi Katsuta, Tokyo (JP); Yoshitaka Ozeki, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 562 days.

(21) Appl. No.: 17/886,977

(22) Filed: Aug. 12, 2022

(65) Prior Publication Data

US 2023/0057376 A1 Feb. 23, 2023

(30) Foreign Application Priority Data

Aug. 19, 2021 (JP) .................. 2021-134415

(51) Int. Cl.
*H10F 39/00* (2025.01)
*H10F 39/12* (2025.01)
*H10F 39/18* (2025.01)

(52) U.S. Cl.
CPC ....... *H10F 39/80373* (2025.01); *H10F 39/18* (2025.01); *H10F 39/198* (2025.01); *H10F 39/8033* (2025.01)

(58) Field of Classification Search
CPC ........... H10F 39/80373; H10F 39/8033; H10F 39/198; H10F 39/18
See application file for complete search history.

(56) References Cited

U.S. PATENT DOCUMENTS

| | | | | |
|---|---|---|---|---|
| 11,923,390 B2* | 3/2024 | Kim | ................ | H01L 25/18 |
| 2014/0151832 A1* | 6/2014 | Saiki | ................ | H10F 39/802 |
| | | | | 257/431 |
| 2014/0151838 A1* | 6/2014 | Iizuka | ................ | H10F 39/026 |
| | | | | 438/66 |
| 2014/0367552 A1* | 12/2014 | Hynecek | ............ | H10F 39/8037 |
| | | | | 257/230 |
| 2015/0028392 A1* | 1/2015 | Tomita | ................ | H10F 39/802 |
| | | | | 257/222 |
| 2015/0028393 A1* | 1/2015 | Tomita | ................ | H10F 39/8057 |
| | | | | 257/222 |
| 2015/0123178 A1* | 5/2015 | Nishida | ................ | H10F 39/18 |
| | | | | 257/292 |
| 2016/0035774 A1* | 2/2016 | Noh | ................ | H10F 39/014 |
| | | | | 257/229 |
| 2016/0268322 A1* | 9/2016 | Watanabe | ......... | H10F 39/80373 |
| 2017/0047449 A1* | 2/2017 | Takechi | ................ | H10D 99/00 |
| 2017/0263661 A1* | 9/2017 | Ikeda | ................ | H10F 39/8037 |

(Continued)

*Primary Examiner* — Nathan W Ha
(74) *Attorney, Agent, or Firm* — K&L Gates LLP

(57) ABSTRACT

According to an aspect, a detection device includes: a substrate; a plurality of transistors provided on the substrate; a plurality of scan lines that extend in a first direction; a plurality of signal lines that extend in a second direction intersecting the first direction; a plurality of photodiodes that are provided in an area surrounded by the scan lines and the signal lines and each include a p-type semiconductor layer, an i-type semiconductor layer, and an n-type semiconductor layer; and a shield wiring line that extends in the first direction and overlaps a corresponding one of the scan lines. The shield wiring line is electrically coupled to, among the signal lines, a power supply signal line configured to supply a power supply potential to the transistors.

14 Claims, 14 Drawing Sheets

(56) References Cited

U.S. PATENT DOCUMENTS

| | | |
|---|---|---|
| 2020/0089928 A1 | 3/2020 | Long |
| 2020/0343287 A1* | 10/2020 | Nakata ................ H10F 39/811 |
| 2021/0098516 A1* | 4/2021 | Chen .................... H10F 39/024 |
| 2021/0249456 A1* | 8/2021 | Miyanami ............ H10F 39/024 |
| 2023/0013149 A1* | 1/2023 | Akiyama .............. H10F 39/80 |
| 2023/0071795 A1* | 3/2023 | Watanabe ............ G01S 17/894 |
| 2023/0299113 A1* | 9/2023 | Iida ..................... H10F 39/8027 |
| | | 257/291 |

* cited by examiner

DETECTION DEVICE

CROSS-REFERENCE TO RELATED APPLICATION

This application claims the benefit of priority from Japanese Patent Application No. 2021-134415 filed on Aug. 19, 2021, the entire contents of which are incorporated herein by reference.

BACKGROUND

1. Technical Field

What is disclosed herein relates to a detection device.

2. Description of the Related Art

United States Patent Application Publication No. 2020/0089928 describes an optical imaging device that includes a light-blocking layer provided with an opening between a microlens and a photosensor. A positive-intrinsic-negative (PIN) photodiode is known as such a photosensor. The PIN photodiode has a structure in which a p-type semiconductor layer, an i-type semiconductor layer, and an n-type semiconductor layer are stacked.

The PIN photodiode can be improved in detection sensitivity by increasing its sensing area to increase a photocurrent. However, increasing the sensing area reduces the distance between the photodiode and a scan line, which may increase parasitic capacitance. This parasitic capacitance may cause variation in output signals from the photodiodes, which may reduce detection accuracy.

SUMMARY

According to an aspect, a detection device includes: a substrate; a plurality of transistors provided on the substrate; a plurality of scan lines that extend in a first direction; a plurality of signal lines that extend in a second direction intersecting the first direction; a plurality of photodiodes that are provided in an area surrounded by the scan lines and the signal lines and each include a p-type semiconductor layer, an i-type semiconductor layer, and an n-type semiconductor layer; and a shield wiring line that extends in the first direction and overlaps a corresponding one of the scan lines. The shield wiring line is electrically coupled to, among the signal lines, a power supply signal line configured to supply a power supply potential to the transistors.

According to an aspect, a detection device includes: a substrate; a plurality of transistors provided on the substrate; a plurality of scan lines that extend in a first direction; a plurality of signal lines that extend in a second direction intersecting the first direction; a plurality of photodiodes that are provided in an area surrounded by the scan lines and the signal lines, and each include a p-type semiconductor layer, an i-type semiconductor layer, and an n-type semiconductor layer; and a shield wiring line that extends in the first direction so as to overlap a corresponding one of the scan lines and is configured to be supplied with a fixed potential.

DETAILED DESCRIPTION

Figure 1A:
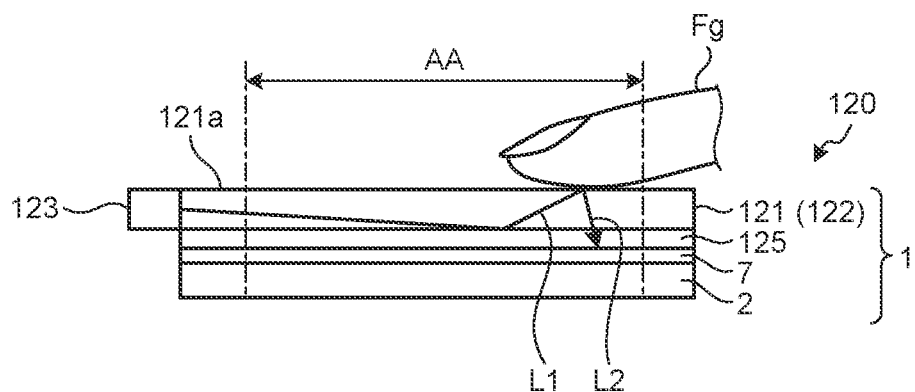
FIG. 1A is a sectional view illustrating a schematic sectional configuration of a detection apparatus with an illumination device, the detection apparatus including a detection device according to a first embodiment.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

Figure 1B:
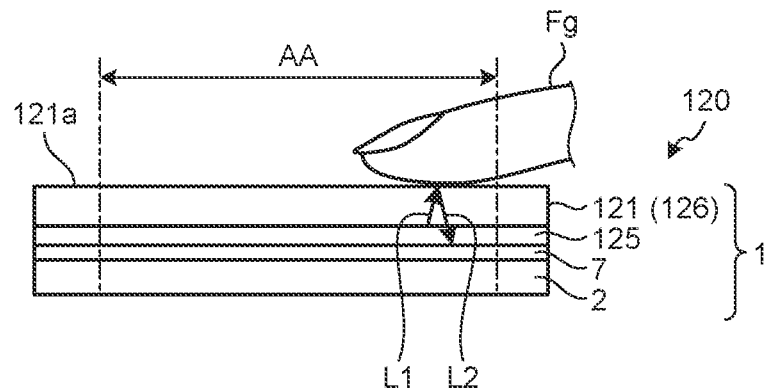
FIG. 1B is a sectional view illustrating a schematic sectional configuration of the detection apparatus with an illumination device, the detection apparatus including the detection device according to a first modification.
Figure 1C:
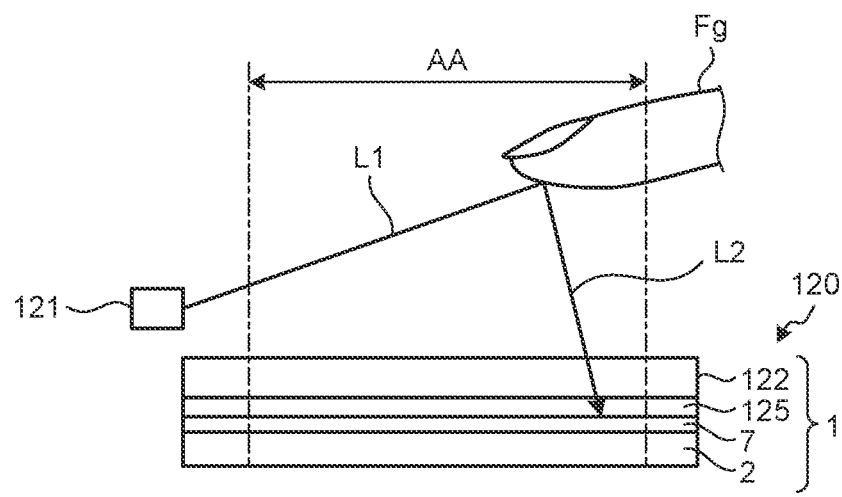
FIG. 1C is a sectional view illustrating a schematic sectional configuration of the detection apparatus with an illumination device, the detection apparatus including the detection device according to a second modification.
Figure 1D:
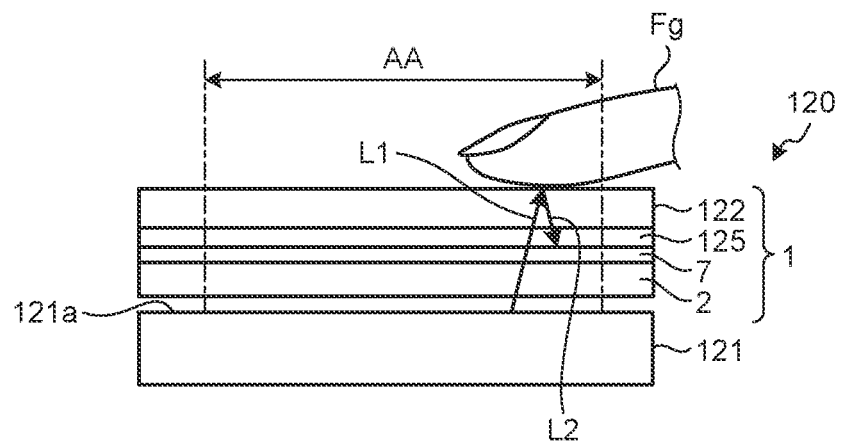
FIG. 1D is a sectional view illustrating a schematic sectional configuration of the detection apparatus with an illumination device, the detection apparatus including the detection device according to a third modification.

FIG. 1A is a sectional view illustrating a schematic sectional configuration of a detection apparatus with an illumination device, the detection apparatus including a detection device according to a first embodiment. FIG. 1B is a sectional view illustrating a schematic sectional configuration of the detection apparatus with an illumination device, the detection apparatus including the detection device according to a first modification. FIG. 1C is a sectional view illustrating a schematic sectional configuration of the detection apparatus with an illumination device, the detection apparatus including the detection device according to a second modification. FIG. 1D is a sectional view illustrating a schematic sectional configuration of the detection apparatus with an illumination device, the detection apparatus including the detection device according to a third modification.

As illustrated in FIG. 1A, a detection apparatus 120 with an illumination device includes a detection device 1 and an illumination device 121. The detection device 1 includes an array substrate 2, an optical filter 7, an adhesive layer 125, and a cover member 122. In other words, the array substrate 2, the optical filter 7, the adhesive layer 125, and the cover member 122 are stacked in this order in a direction orthogonal to a surface of the array substrate 2. The adhesive layer 125 only needs to transmit light and bond the optical filter 7 to the cover member 122. The detection device 1 may have a structure not including the adhesive layer 125 in an area corresponding to a detection area AA. When the detection area AA does not include the adhesive layer 125, the structure is configured such that the adhesive layer 125 bonds the cover member 122 to the optical filter 7 in an area corresponding to a peripheral area GA outside the detection area AA, and the detection area AA is provided with an air layer. The adhesive layer 125 provided in the detection area AA may simply be rephrased as a protective layer for the optical filter 7.

In FIG. 1A, the illumination device 121 is what is called a side-light type front light that includes a light guide plate that also serves as the cover member 122 of the detection device 1 and a plurality of light sources 123 arranged at one end or both ends of the cover member 122 (light guide plate). The cover member 122 has a light-emitting surface 121a from which light is emitted. The illumination device 121 emits light L1 from the light-emitting surface 121a of the cover member 122 toward a finger Fg that serves as a detection target. For example, light-emitting diodes (LEDs) for emitting light in a predetermined color are used as the light sources.

As illustrated in FIG. 1B, the illumination device 121 may include one or a plurality of light sources (such as LEDs) directly above the detection area AA of the detection device 1, in which case the illumination device 121 including the light sources also serves as the cover member 122.

The illumination device 121 is not limited to the example of FIG. 1B. As illustrated in FIG. 1C, the light sources may be provided on a lateral side or an upper side of the cover member 122 and may emit the light L1 from the lateral side or the upper side of the finger Fg to the finger Fg.

Moreover, as illustrated in FIG. 1D, the illumination device 121 may be what is called a direct-type backlight that includes the light sources (such as the LEDs) provided in the detection area of the detection device 1. In this case, the light guide plate of the illumination device 121 is a member separate from the cover member 122 of the detection device 1 and is disposed below the detection device 1.

The light L1 emitted from the illumination device 121 is reflected as light L2 by the finger Fg serving as the detection target. The detection device 1 detects the light L2 (shade of light L2 or intensity of reflected light) reflected by the finger Fg to detect asperities (such as a fingerprint) on a surface of the finger Fg. The detection device 1 may further detect information on a living body by detecting the light L2 reflected in the finger Fg, in addition to detecting the fingerprint. Examples of the information on the living body include a blood vessel image of, for example, a vein; pulsation; and a pulse wave. The color of the light L1 from the illumination device 121 may be varied depending on the detection target. In the present embodiment, the detection device 1 regards the finger Fg (fingerprint) as an object to be detected (detection target). However, the object to be detected is not limited to the finger Fg and may be any part as long as it is a part of a living body, such as a palm, a wrist, or a sole.

The cover member 122 is a member for protecting the array substrate 2 and the optical filter 7 and covers the array substrate 2 and the optical filter 7. As described above, the cover member 122 may have a structure to serve also as the light guide plate of the illumination device 121. In the structures illustrated in FIGS. 1C and 1D in which the cover member 122 is separate from the illumination device 121, the cover member 122 is, for example, a glass substrate. The cover member 122 is not limited to the glass substrate, and may be, for example, a resin substrate or a resin film or may be made up of a plurality of layers obtained by stacking these substrates or films. The cover member 122 need not be provided. In this case, the surface of the array substrate 2 and the optical filter 7 is provided with a protective layer of, for example, an insulating film, and the finger Fg contacts the protective layer of the detection device 1.

The optical filter 7 is an optical element that transmits, toward photodiodes 30, components of the light L2 that have been reflected by the object to be detected such as the finger Fg and travel in a third direction Dz (refer to FIGS. 6 and 7) of the array substrate 2, and blocks components of the light L2 that travel in oblique directions. The optical filter 7 is also called, for example, collimating apertures or a collimator. The optical filter 7 need not be provided.

The detection apparatus 120 with an illumination device described above may be provided with a display panel 126 instead of the illumination device 121 as illustrated in FIG. 1B. The display panel 126 may be, for example, an organic electroluminescent (EL) diode (organic light-emitting diode (OLED)) display panel or an inorganic EL (micro-LED or mini-LED) display panel. Alternatively, the display panel 126 may be a liquid crystal display (LCD) panel using liquid crystal elements as display elements or an electrophoretic display (EPD) panel using electrophoretic elements as the display elements. In this case, display light (light L1) emitted from the display panel 126 is reflected by the finger Fg, and the reflected light passes through the display panel 126 and reaches the optical filter 7. In view of this fact, the display panel 126 preferably has a light-transmitting portion including a light-transmitting substrate or multi-layered film at least in the detection area AA. The fingerprint of the finger Fg and the information on the living body can be detected based on the light L2.

Figure 2:
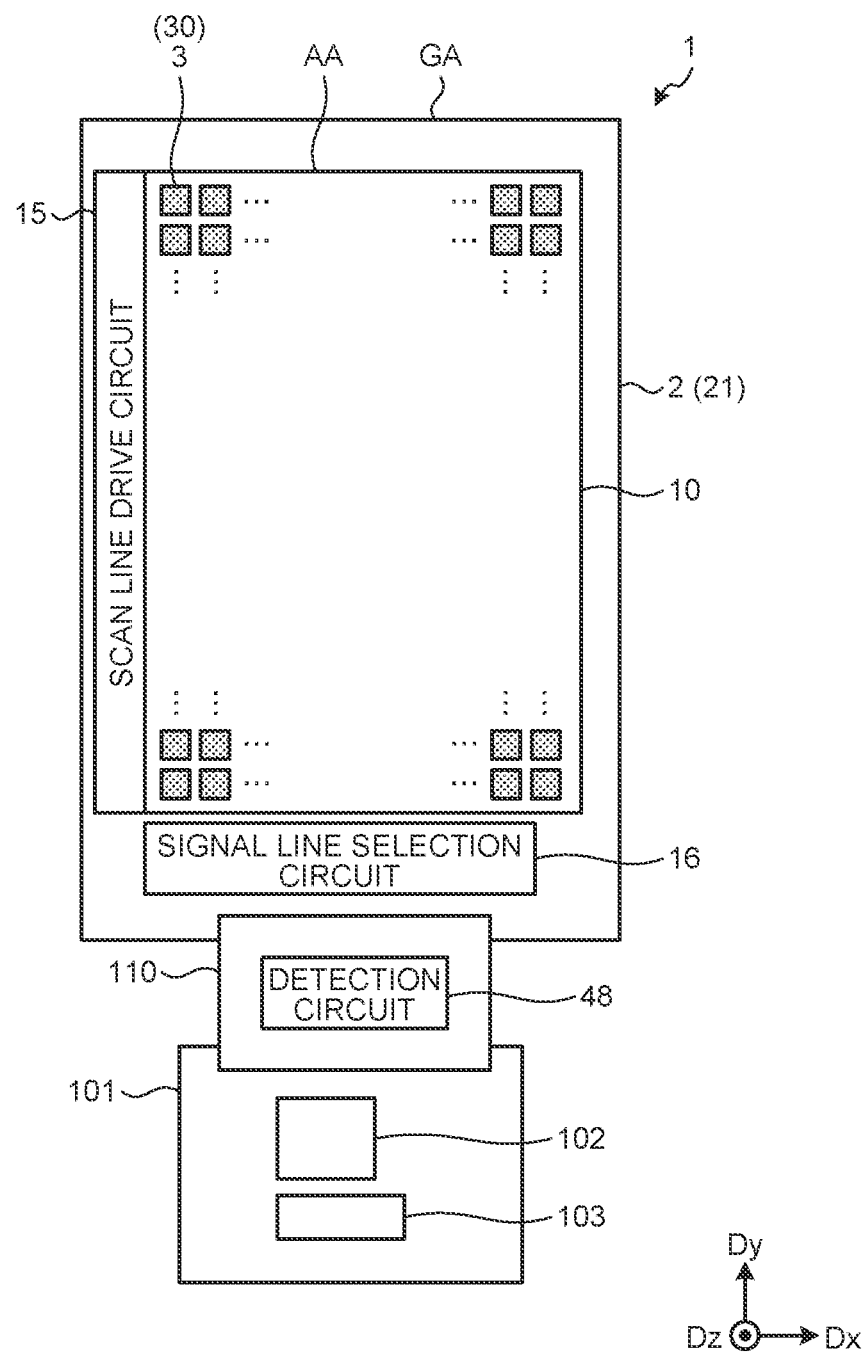
FIG. 2 is a plan view illustrating the detection device according to the first embodiment.

FIG. 2 is a plan view illustrating the detection device according to the first embodiment. A first direction Dx, which illustrated in FIG. 2 or later, is one direction in a plane parallel to the substrate 21. A second direction Dy is one direction in the plane parallel to the substrate 21 and is a direction orthogonal to the first direction Dx. The second direction Dy may non-orthogonally intersect the first direction Dx. The third direction Dz is a direction orthogonal to the first direction Dx and the second direction Dy and is a direction normal to the substrate 21. The term "plan view" refers to a positional relation when viewed from the third direction Dz.

As illustrated in FIG. 2, the detection device 1 includes the array substrate 2 (substrate 21), a sensor 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA) or another integrated circuit (IC) chip. The control circuit 102 supplies control signals to the sensor 10, the scan line drive circuit 15, and the signal line selection circuit 16 to control an operation of the sensor 10. The power supply circuit 103 supplies voltage signals including, for example, a power supply potential VDD and a reference potential VCOM (refer to FIG. 4) to the sensor 10, the scan line drive circuit 15, and the signal line selection circuit 16. In the present embodiment, the case is exemplified where the detection circuit 48 is disposed on the wiring substrate 110, but the present disclosure is not limited to this case. The detection circuit 48 may be disposed on the substrate 21. A configuration can also be employed in which the detection circuit 48 incorporates a part or the whole of the control circuit 102 and the power supply circuit 103.

The substrate 21 has the detection area AA and the peripheral area GA. Elements (detection elements 3) of the sensor 10 are provided in the detection area AA. The peripheral area GA is an area outside the detection area AA and is an area not provided with the elements (detection elements 3). That is, the peripheral area GA is an area between the outer perimeter of the detection area AA and the ends of the substrate 21. The scan line drive circuit 15 and the signal line selection circuit 16 are provided in the peripheral area GA. Specifically, the scan line drive circuit 15 is provided along one of the right and left sides of the detection area AA in an area extending along the second direction Dy in the peripheral area GA. As will be described later, a configuration can also be employed in which the scan line drive circuits 15 are provided along the second direction Dy on both sides of the detection area AA. The signal line selection circuit 16 is provided along the lower side of the detection area AA and is provided between the sensor 10 and the detection circuit 48.

Each of the detection elements 3 of the sensor 10 is a photosensor including one or more of the photodiodes 30 as a sensor element or sensor elements. Each of the photodiodes 30 is a photoelectric conversion element, and outputs an electrical signal corresponding to light irradiating the photodiode 30. More specifically, the photodiode 30 is a positive-intrinsic-negative (PIN) photodiode. The photodiode 30 may also be rephrased as an organic photo diode (OPD). The detection elements 3 are arranged in a matrix having a row-column configuration in the detection area AA. The photodiode 30 included in each of the detection elements 3 performs detection in accordance with gate drive signals (for example, a reset control signal RST and a read control signal RD) supplied from the scan line drive circuit 15. Each of the photodiodes 30 changes the electrical signal corresponding to the light irradiating the photodiode 30 and outputs the change in the electrical signal as a detection signal Vdet in the detection element 3 to the signal line selection circuit 16. The detection device 1 detects the information on the living body based on the detection signals Vdet received from the respective detection elements 3.

Figure 3:
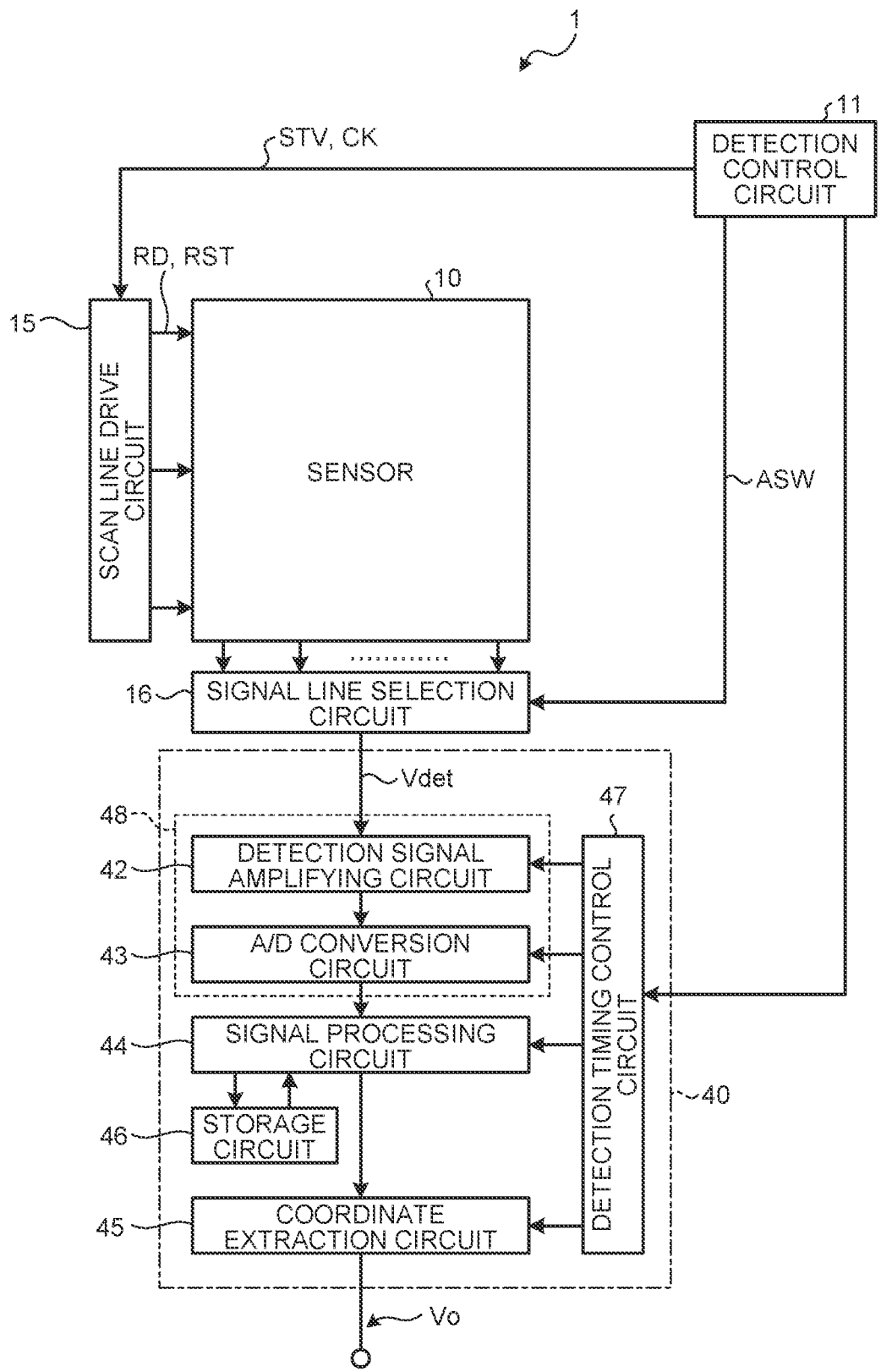
FIG. 3 is a block diagram illustrating a configuration example of the detection device according to the first embodiment.

FIG. 3 is a block diagram illustrating a configuration example of the detection device according to the first embodiment. As illustrated in FIG. 3, the detection device 1 includes a detection control circuit 11 and a detector 40. One, some, or all of the functions of the detection control circuit 11 are included in the control circuit 102. One, some, or all of the functions of the detector 40 other than those of the detection circuit 48 are also included in the control circuit 102.

The detection control circuit 11 is a circuit that supplies respective control signals to the scan line drive circuit 15, the signal line selection circuit 16, and the detector 40 to control operations thereof. The detection control circuit 11 supplies various control signals such as a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of scan lines (read control scan lines GLrd and reset control scan lines GLrst (refer to FIG. 4)) based on the various control signals. The scan line drive circuit 15 sequentially or simultaneously selects the scan lines and supplies the gate drive signals (for example, the reset control signals RST and the read control signals RD) to the selected scan lines. By this operation, the scan line drive circuit 15 selects the detection elements 3 coupled to the scan lines.

Figure 4:
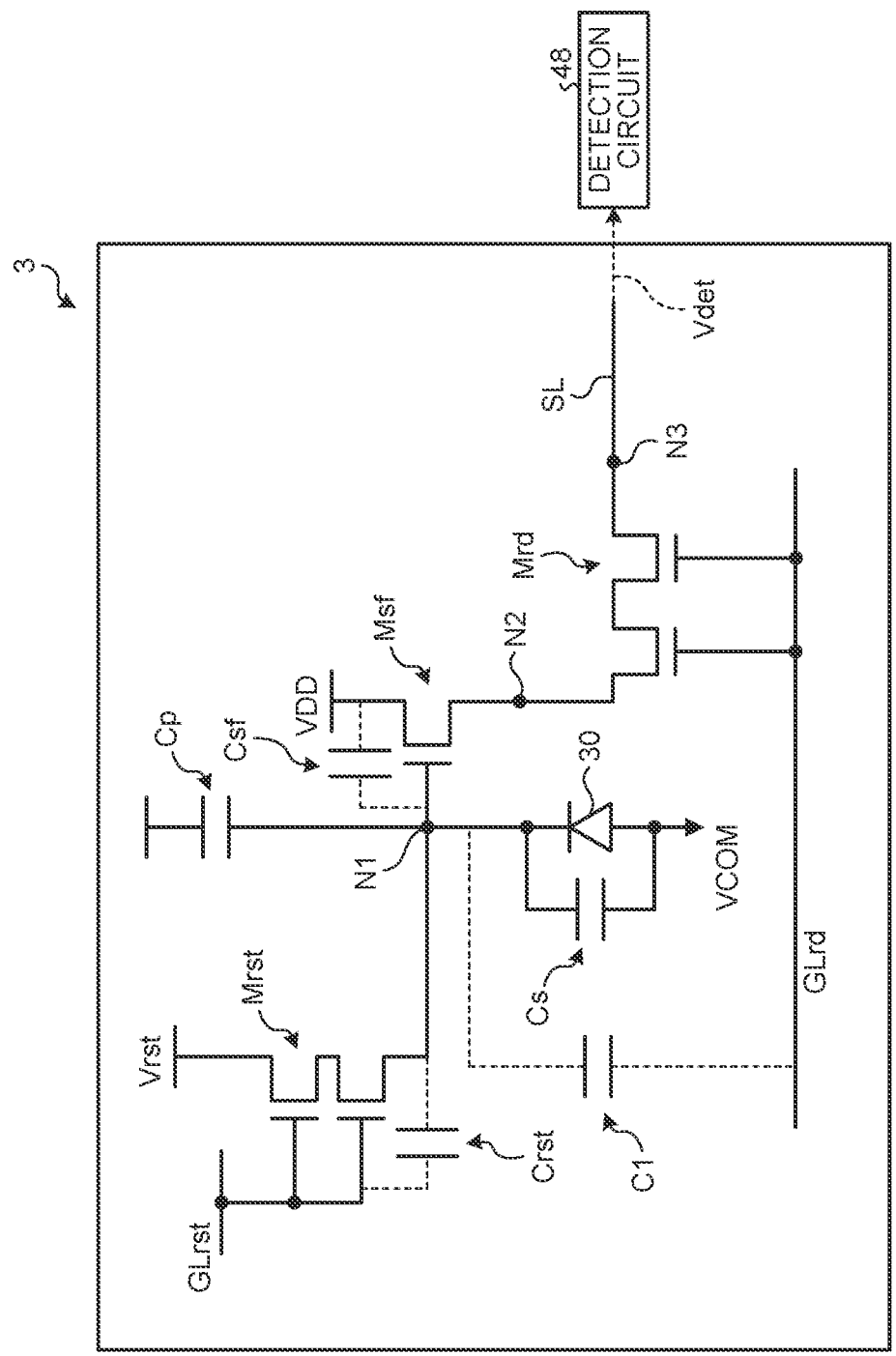
FIG. 4 is a circuit diagram illustrating a detection element.

The signal line selection circuit 16 is a switch circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the selection signal ASW supplied from the detection control circuit 11. By this operation, the signal line selection circuit 16 outputs the detection signals Vdet of the photodiodes 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 is a circuit that amplifies the detection signal Vdet and is an integration circuit, for example. The A/D conversion circuit 43 converts an analog signal output from the detection signal amplifying circuit 42 into a digital signal.

The signal processing circuit 44 is a logic circuit that detects a predetermined physical quantity received by the sensor 10 based on output signals of the detection circuit 48. The signal processing circuit 44 can detect the asperities on the surface of the finger Fg or the palm (fingerprint or palm print) based on the signals from the detection circuit 48 when the finger Fg is in contact with or in proximity to a detection surface. The signal processing circuit 44 may detect the information on the living body based on the signals from the detection circuit 48. Examples of the information on the living body include the blood vessel image, the pulse wave, the pulsation, and a blood oxygen saturation level of the finger Fg or the palm.

The storage circuit 46 temporarily stores therein signals calculated by the signal processing circuit 44. The storage circuit 46 may be, for example, a random-access memory (RAM) or a register circuit.

The coordinate extraction circuit 45 combines the detection signals Vdet output from the respective detection elements 3 of the sensor 10 to generate two-dimensional information representing a shape of the asperities on the surface of the finger Fg or the like. The coordinate extraction circuit 45 may output the detection signals Vdet as sensor outputs Vo instead of calculating detected coordinates.

The following describes a circuit configuration example of the detection device 1. FIG. 4 is a circuit diagram illustrating the detection element. As illustrated in FIG. 4, the detection element 3 includes the photodiode 30, a reset transistor Mrst, a read transistor Mrd, and a source follower transistor Msf. The reset transistor Mrst, the read transistor Mrd, and the source follower transistor Msf are provided correspondingly to each of the photodiodes 30. The reset transistor Mrst, the read transistor Mrd, and the source follower transistor Msf are each fabricated from an n-type thin-film transistor (TFT). However, each of the transistors is not limited thereto and may be fabricated from a p-type TFT. While FIG. 4 illustrates one of the photodiodes 30, a configuration can be employed in which the detection element 3 includes a plurality of the photodiodes 30 as described below. Alternatively, when the photodiodes 30 are coupled in parallel, the coupled photodiodes 30 can be considered as one photodiode 30 (in this case, each of the photodiodes 30 is described as a partial photodiode 30S as will be described later).

The reference potential VCOM is applied to the anode of the photodiode 30. The cathode of the photodiode 30 is coupled to a node N1. The node N1 is coupled to a capacitor Cs, one of the source and the drain of the reset transistor Mrst, and the gate of the source follower transistor Msf. The node N1 further has parasitic capacitance Cp and C1 and input capacitance Crst and Csf. When light is incident on the photodiode 30, a signal (electric charge) output from the photodiode 30 is stored in the capacitor Cs.

Figure 7:
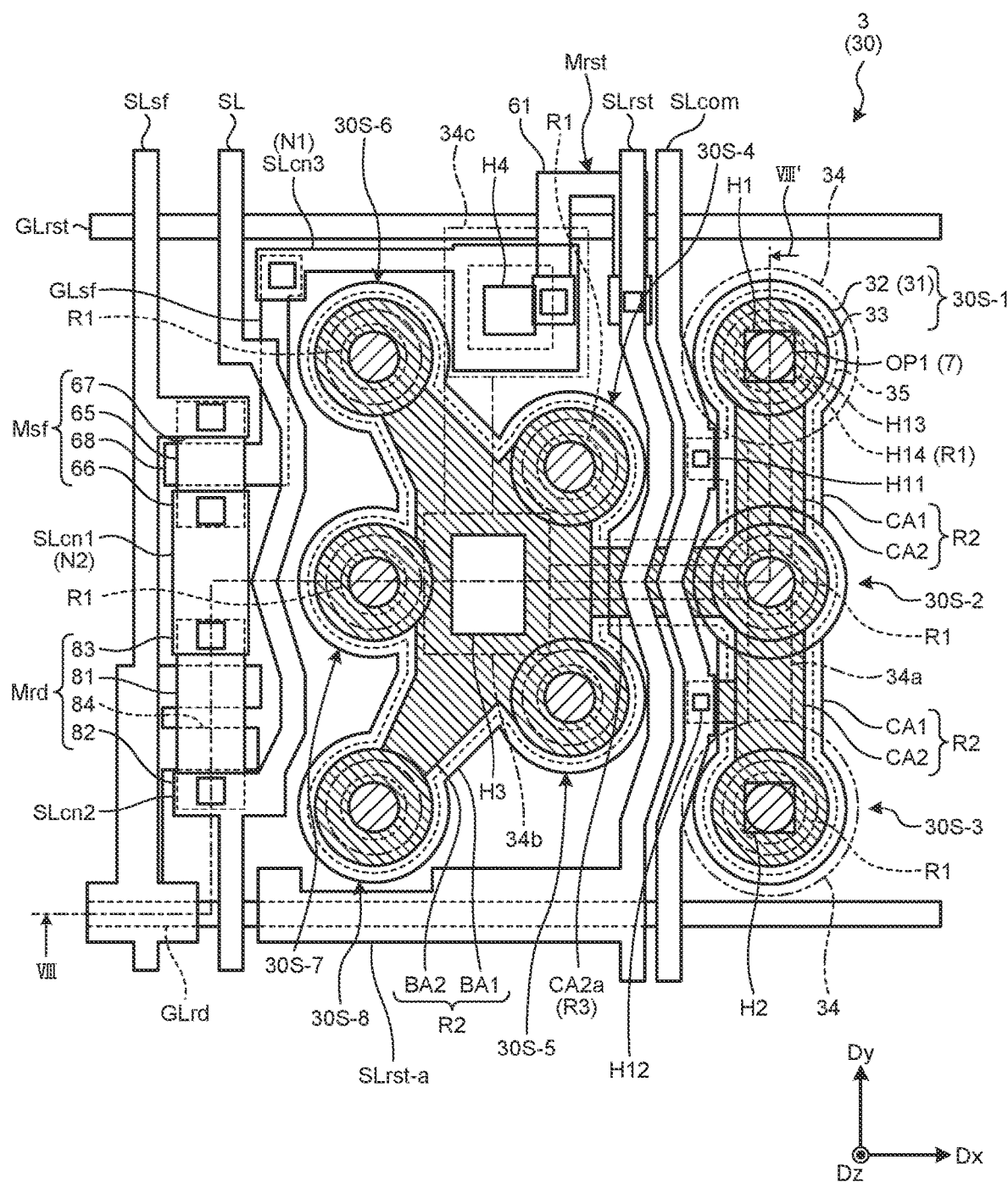
FIG. 7 is a plan view illustrating photodiodes included in each of the detection elements.

The capacitor Cs is, for example, a capacitor formed between a p-type semiconductor layer 33 and an n-type semiconductor layer 32 of the photodiode 30 (refer to FIG. 7). The parasitic capacitance Cp and C1 is capacitance added to that of the capacitor Cs, and is capacitance generated among various types of wiring and electrodes provided on the array substrate 2. More specifically, the parasitic capacitance C1 is capacitance generated between the cathode (n-type semiconductor layer 32) of the photodiode 30 and the scan line (for example, the read control scan line GLrd). The input capacitance values Crst and Csf are capacitance values of the reset transistor Mrst and the source follower transistor Msf, respectively, as viewed from the input side. More specifically, each of the input capacitance values Crst and Csf is a capacitance value obtained by adding a capacitance value between the gate and the source to a capacitance value between the gate and the drain.

The gates of the reset transistor Mrst are coupled to the reset control scan line GLrst. The other of the source and the drain of the reset transistor Mrst is supplied with a reset potential Vrst. When the reset transistor Mrst is turned on (into a conduction state) in response to the reset control signal RST, the potential of the node N1 is reset to the reset potential Vrst. The reference potential VCOM is lower than the reset potential Vrst, and the photodiode 30 is driven in a reverse bias state.

The source follower transistor Msf is coupled between a terminal supplied with the power supply potential VDD and the read transistor Mrd (node N2). The gate of the source follower transistor Msf is coupled to the node N1. The gate of the source follower transistor Msf is supplied with a signal (electric charge) generated by the photodiode 30. This operation causes the source follower transistor Msf to output a voltage signal corresponding to the signal (electric charge) generated by the photodiode 30 to the read transistor Mrd. In the following description, a fixed potential (direct-current potential) having a predetermined potential is employed as the power supply potential VDD. However, a potential having an alternating-current waveform oscillating between predetermined potentials at a predetermined cycle can be employed as the power supply potential.

The read transistor Mrd is coupled between the source of the source follower transistor Msf (node N2) and a corresponding one of the output signal lines SL (node N3). The gates of the read transistor Mrd are coupled to a corresponding one of the read control scan lines GLrd. When the read transistor Mrd is turned on in response to the read control signal RD, the signal output from the source follower transistor Msf, that is, the voltage signal corresponding to the signal (electric charge) generated by the photodiode 30 is output as the detection signal Vdet to the output signal line SL.

In the example illustrated in FIG. 4, the reset transistor Mrst and the read transistor Mrd each have what is called a double-gate structure configured by coupling two transistors in series. However, the reset transistor Mrst and the read transistor Mrd are not limited to this structure, and may have a single-gate structure or may have a multi-gate structure in which three or more transistors are coupled in series. The circuit of each of the detection elements 3 is not limited to the configuration including the three transistors of the reset transistor Mrst, the source follower transistor Msf, and the read transistor Mrd. The detection element 3 may have two transistors or four or more transistors.

Figure 5:
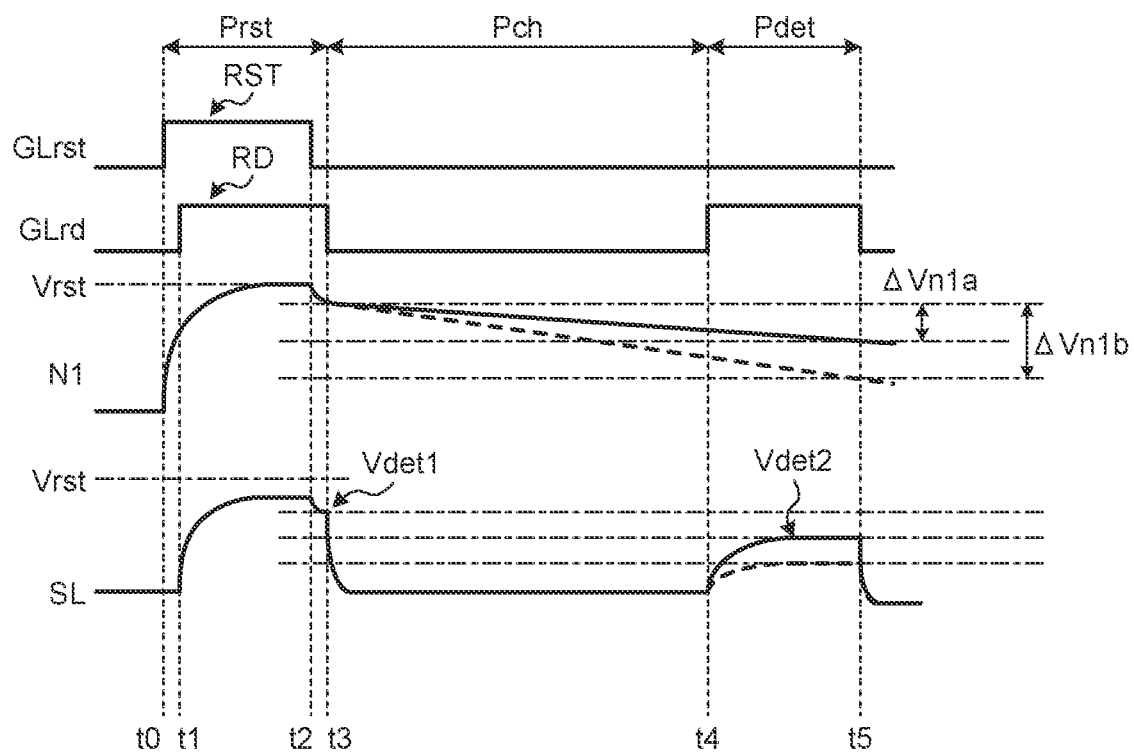
FIG. 5 is a timing waveform diagram illustrating an operation example of the detection element.

FIG. 5 is a timing waveform diagram illustrating an operation example of the detection element. As illustrated in FIG. 5, the detection element 3 performs the detection in the order of a reset period Prst, an exposure period Pch, and a read period Pdet. The power supply circuit 103 supplies the reference potential VCOM to the anode of the photodiode 30 over the reset period Prst, the exposure period Pch, and the read period Pdet.

At time t0, the scan line drive circuit 15 sets the reset control signal RST to be supplied to the reset control scan line GLrst to HIGH (high-level voltage) to start the reset period Prst. In the reset period Prst, the reset transistor Mrst is turned on (into the conduction state) to increase the potential of the node N1 to the reset potential Vrst.

At time t1, the scan line drive circuit 15 sets the read control signal RD to be supplied to the read control scan line GLrd to HIGH (high-level voltage). This operation turns on the read transistor Mrd (into the conduction state).

At time t2, the scan line drive circuit 15 sets the reset control signal RST to LOW (low-level voltage) to end the reset period Prst. At time t2, the reset transistor Mrst is turned off (into a nonconduction state). The signal corresponding to the light irradiating the photodiode 30 is stored to reduce the potential of the node N1 to (Vrst−ΔVn1). ΔVn1 denotes a signal (voltage change amount) corresponding to the light irradiating the photodiode 30.

At time t3, the potential of the detection signal Vdet output from the output signal line SL is set to (Vrst−Vthsf−Vrdon). Vthsf denotes a threshold voltage Vthsf of the source follower transistor Msf. Vrdon denotes a voltage drop caused by on-resistance of the read transistor Mrd.

At time t3, the scan line drive circuit 15 sets the read control signal RD to LOW (low-level voltage). This operation turns off the read transistor Mrd (into the nonconduction state) to set the potential of the node N2 to be constant and also set the potential of the detection signal Vdet output from the output signal line SL to LOW (low-level voltage).

At time t4, the scan line drive circuit 15 sets the read control signal RD again to HIGH (high-level voltage). This operation turns on the read transistor Mrd (into the conduction state) to end the exposure period Pch and start the read period Pdet. The potential of a detection signal Vdet2 output in the read period Pdet decreases by an amount of the signal ΔVn1 from the potential of a detection signal Vdet1 obtained at time t3 and is set to (Vrst−Vthsf−Vrdon−ΔVn1).

The detector 40 can detect the light irradiating the photodiode 30 based on the signal (ΔVn1) of the difference between the detection signal Vdet1 at time t3 and the detection signal Vdet2 at time t5. For example, a signal ΔVn1$a$ illustrated in FIG. 5 is a signal (voltage change amount) produced when illuminance is low, and a signal ΔVn1$b$ is a signal (voltage change amount) produced when the illuminance is high. The detection device 1 can detect the intensity of the light L2 based on the difference between the signal ΔVn1$a$ and the signal ΔVn1$b$, for each of the detection elements 3. Accumulating the detection results of the individual detection elements 3 allows the detection of, for example, the fingerprint and the blood vessel image (vein pattern) of the finger that contacts or closely faces the detection surface.

While FIG. 5 illustrates the operation example of one of the detection elements 3, the scan line drive circuit 15 can cause the detection elements 3 in the entire detection area AA to perform the detection by sequentially scanning the reset control scan lines GLrst and the read control scan lines GLrd in a time-division manner. The signal line selection circuit 16 can cause the detection elements 3 in the entire detection area AA to perform the detection by sequentially or simultaneously selecting the output signal lines SL and coupling the selected output signal lines SL to the detection circuit 48. A configuration and an operation example of the signal line selection circuit 16 will be described later.

When capacitance Cn1 denotes the sum of capacitance values added to the photodiode 30, the capacitance Cn1 is represented by Expression (1) below. The capacitor Cs, the parasitic capacitance Cp, and the input capacitance Crst and Csf are various capacitances (capacitors) equivalently coupled to the cathode (node N1) of the photodiode 30 described above with reference to FIG. 4.

$$Cn1 = Cs + Crst + Csf + Cp + C1 \quad (1)$$

The signal ΔVn1 is represented by Expression (2) below. ΔQ denotes an electric charge stored during the exposure period Pch; Ip denotes a photocurrent that flows depending on the light irradiating the photodiode 30; and T denotes an exposure time (from time t3 to time t4).

$$\Delta Vn1 = \Delta Q / Cn1 = (Ip \times T) / Cn1 \quad (2)$$

As represented by Expression (2), reducing the capacitance Cn1 can increase the signal ΔVn1. That is, reducing the capacitance Cn1 can improve the detection sensitivity of the detection device 1 even when the same object to be detected is detected under the same detection conditions. Alternatively, reducing the variation of the capacitance Cn1 can reduce the variation of the signal ΔVn1. That is, the detection variation of the detection device 1 can be reduced by reducing the parasitic capacitance C1.

Figure 6:
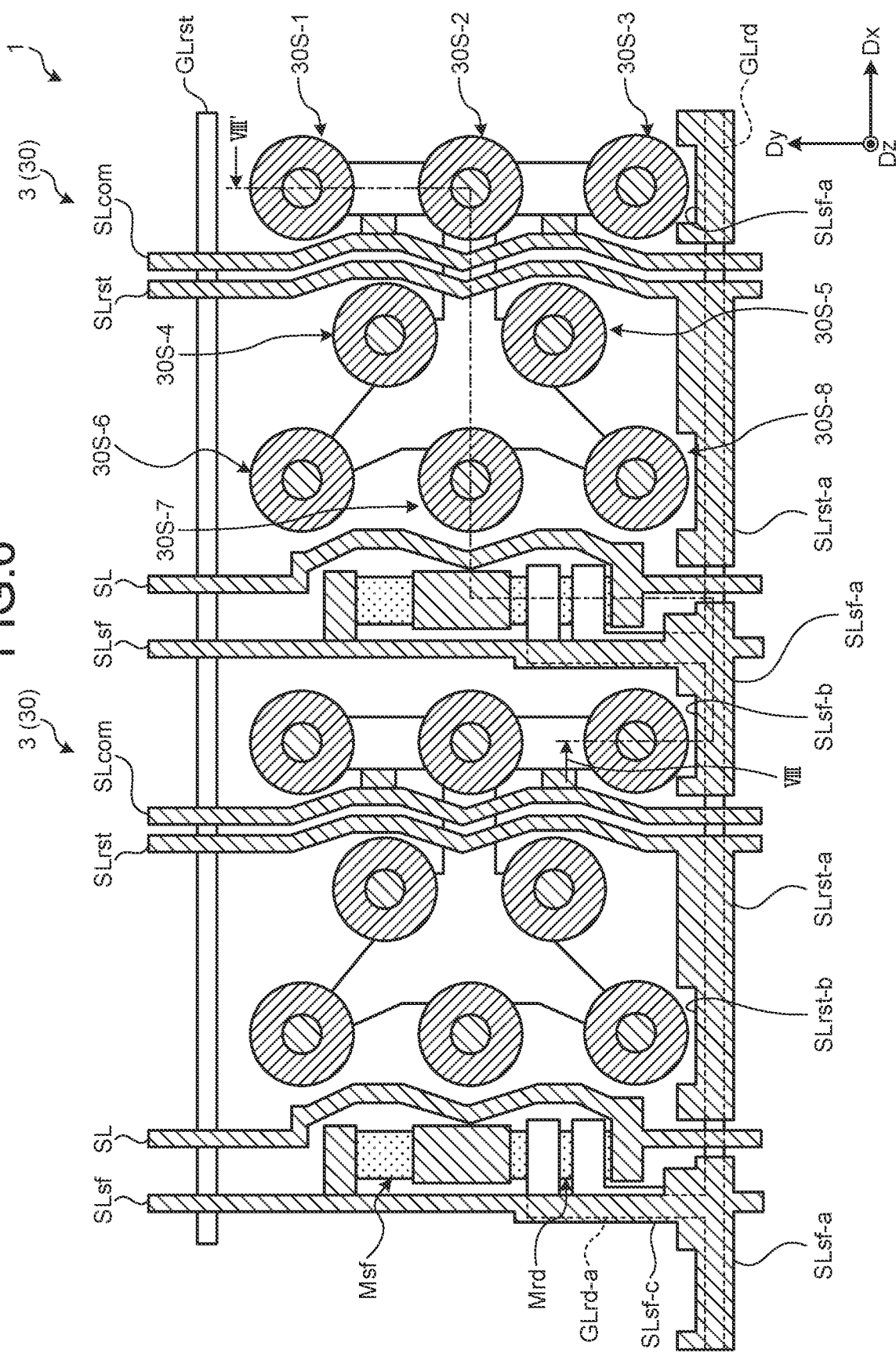
FIG. 6 is a plan view illustrating the detection elements.

The following describes a planar configuration and a sectional configuration of the detection elements 3. FIG. 6 is a plan view illustrating the detection elements. For ease of viewing, FIG. 6 does not illustrate a portion of the configuration of the photodiodes 30 and the transistors.

As illustrated in FIG. 6, each of the detection elements 3 includes two scan lines (read control scan line GLrd and reset control scan line GLrst) and four signal lines (output signal line SL, power supply signal line SLsf, reset signal line SLrst, and reference signal line SLcom). The detection element 3 further includes a first shield wiring line SLsf-a and a second shield wiring line SLrst-a.

The read control scan line GLrd and the reset control scan line GLrst extend in the first direction Dx, and are arranged in the second direction Dy. The output signal line SL, the power supply signal line SLsf, the reset signal line SLrst, and the reference signal line SLcom extend in the second direction Dy and are arranged in the first direction Dx.

The detection element 3 is defined by an area surrounded by the two scan lines (read control scan line GLrd and reset control scan line GLrst) and two signal lines (for example, two power supply signal lines SLsf of the adjacent detection elements 3).

As illustrated in FIG. 6, the photodiode 30 includes a plurality of partial photodiodes 30S-1, 30S-2, ..., 30S-8. The partial photodiodes 30S-1, 30S-2, ..., 30S-8 are arranged in a triangular lattice pattern.

More specifically, the partial photodiodes 30S-1, 30S-2, and 30S-3 are arranged in the second direction Dy. The partial photodiodes 30S-4 and 30S-5 are arranged in the second direction Dy and are adjacent in the first direction Dx to an element column made up of the partial photodiodes 30S-1, 30S-2, and 30S-3. The partial photodiodes 30S-6, 30S-7, and 30S-8 are arranged in the second direction Dy and are adjacent in the first direction Dx to an element column made up of the partial photodiodes 30S-4 and 30S-5. The positions in the second direction Dy of the partial photodiodes 30S are arranged in a staggered manner between the adjacent element columns.

The light L2 is incident on each of the partial photodiodes 30S-1, 30S-2, ..., 30S-8 through the optical filter 7. The partial photodiodes 30S-1, 30S-2, ..., 30S-8 are electrically coupled together to serve as one photodiode 30. That is, signals output by the partial photodiodes 30S-1, 30S-2, ..., 30S-8 are put together and output as each of the detection signals Vdet from the photodiode 30. In the following description, the partial photodiodes 30S-1, 30S-2, ..., 30S-8 are each simply referred to as the partial photodiode 30S when they need not be distinguished from one another.

As illustrated in FIG. 6, the signal lines are repeatedly arranged in the first direction Dx in the order of the power supply signal line SLsf, the output signal line SL, the reset signal line SLrst, the reference signal line SLcom, the power supply signal line SLsf, . . . . The partial photodiodes 30S-1, 30S-2, and 30S-3 are disposed between the reference signal line SLcom and the power supply signal line SLsf coupled to the adjacent detection element 3 in the first direction Dx. The partial photodiodes 30S-4, 30S-5, . . . , 30S-8 are disposed between the output signal line SL and the reset signal line SLrst in the first direction Dx. The partial photodiodes 30S are disposed between the read control scan line GLrd and the reset control scan line GLrst adjacent to each other in the second direction Dy.

The first shield wiring line SLsf-a and the second shield wiring line SLrst-a overlap the read control scan line GLrd and extend in the first direction Dx. The first shield wiring line SLsf-a and the second shield wiring line SLrst-a are provided in the same layer as that of the signal lines (power supply signal line SLsf, output signal line SL, reset signal line SLrst, and reference signal line SLcom). The first shield wiring line SLsf-a and the second shield wiring line SLrst-a are each electrically coupled to a signal line among the signal lines that supplies a fixed potential (power supply potential VDD or reset potential Vrst) to the transistors. This configuration supplies a predetermined fixed potential to each of the first shield wiring line SLsf-a and the second shield wiring line SLrst-a.

In more detail, the first shield wiring line SLsf-a is coupled to the power supply signal line SLsf and extends in a direction (first direction Dx) intersecting the power supply signal line SLsf. The first shield wiring line SLsf-a is supplied with a signal having the same potential as that of the power supply signal line SLsf (power supply potential VDD). The first shield wiring line SLsf-a includes a portion extending toward one side in the first direction Dx (right side of FIG. 6; +Dx direction) and a portion extending toward the other side in the first direction Dx (left side of FIG. 6; −Dx direction) from the power supply signal line SLsf. With this configuration, the first shield wiring line SLsf-a covers the read control scan line GLrd located between the power supply signal line SLsf and the output signal line SL on the one side in the first direction Dx (right side of FIG. 6) and covers the read control scan line GLrd located between the power supply signal line SLsf and the reference signal line SLcom on the other side in the first direction Dx (left side of FIG. 6). The first shield wiring line SLsf-a is provided so as to be separate from the output signal line SL and the reference signal line SLcom.

The second shield wiring line SLrst-a is coupled to the reset signal line SLrst and extends in the first direction Dx that is a direction intersecting the reset signal line SLrst. The second shield wiring line SLrst-a is supplied with a signal having the same potential as that of the reset signal line SLrst (reset potential Vrst). The second shield wiring line SLrst-a extends toward the other side in the first direction Dx (left side of FIG. 6) and covers the read control scan line GLrd located between the reset signal line SLrst and the output signal line SL. The second shield wiring line SLrst-a is provided so as to be separate from the output signal line SL.

In other words, the output signal line SL among the signal lines that outputs the detection signal Vdet from the photodiode 30 is disposed between the first shield wiring line SLsf-a and the second shield wiring line SLrst-a in the first direction Dx and is provided so as to be separate from the first shield wiring line SLsf-a and the second shield wiring line SLrst-a. The reference signal line SLcom among the signal lines that supplies the reference potential VCOM to the photodiode 30 is disposed between the first shield wiring line SLsf-a and the second shield wiring line SLrst-a in the first direction Dx and is provided so as to be separate from the first shield wiring line SLsf-a and the second shield wiring line SLrst-a.

The width in the second direction Dy of each of the first shield wiring line SLsf-a and the second shield wiring line SLrst-a is greater than the width in the second direction Dy of the read control scan line GLrd. A recess SLsf-b dented in the width direction (second direction Dy) is formed in an area of the first shield wiring line SLsf-a adjacent to the partial photodiode 30S-3. A recess SLrst-b dented in the width direction (second direction Dy) is formed in an area of the second shield wiring line SLrst-a adjacent to the partial photodiode 30S-8. With this configuration, the first shield wiring line SLsf-a and the second shield wiring line SLrst-a are provided so as not to overlap the partial photodiodes 30S and thus can restrain occurrence of short circuits with the partial photodiodes 30S.

The read control scan line GLrd is coupled to a branch GLrd-a extending in the second direction Dy, and the branch GLrd-a is coupled to gate electrodes 84 of the read transistor Mrd (refer to FIG. 7). The branch GLrd-a is provided so as to overlap the power supply signal line SLsf.

The power supply signal line SLsf has, in a portion overlapping the branch GLrd-a, a widened portion SLsf-c that has a greater width than a portion not overlapping the branch GLrd-a. With this configuration, the widened portion SLsf-c covers the entire the branch GLrd-a.

With the configuration describe above, the first shield wiring line SLsf-a is provided so as to cover the read control scan line GLrd and is supplied with the fixed potential from the power supply signal line SLsf. The second shield wiring line SLrst-a is provided so as to cover the read control scan line GLrd and is supplied with the fixed potential from the reset signal line SLrst. The first shield wiring line SLsf-a and the second shield wiring line SLrst-a cover most of the area of the read control scan line GLrd.

This configuration can reduce the parasitic capacitance C1 (refer to FIG. 4) generated between the read control scan line GLrd and the photodiodes 30 (in particular, the partial photodiodes 30S-3 and 30S-8). As a result, the detection sensitivity of the detection device 1 can be improved as represented by Expression (2) given above. Even when the read control signal RD is supplied to the read control scan line GLrd and the potential of the read control scan line GLrd changes, the potential of the node N1 (cathode of the photodiode 30) is restrained from changing because the parasitic capacitance C1 has been reduced. The variation in the parasitic capacitance C1, which would be caused by variation in arrangement relation (distance) between the read control scan line GLrd and the partial photodiodes 30S, can be restrained. As a result, the variation in detection of the detection device 1 can be reduced.

The following describes a detailed configuration of the photodiodes 30 and the transistors. FIG. 7 is a plan view illustrating the photodiodes included in each of the detection elements. FIG. 7 illustrates a magnified view of a planar configuration of the photodiodes 30 and the transistors included in the detection element 3. In FIG. 7, an opening OP1 provided so as to overlap each of the partial photodiodes 30S-1, 30S-2, . . . , 30S-8 corresponds to a light guide portion of the optical filter 7 (refer to FIGS. 1A to 1D), and the light L2 is emitted in each area overlapping the opening OP1.

Each of the partial photodiodes 30S includes an i-type semiconductor layer 31, the n-type semiconductor layer 32, and the p-type semiconductor layer 33. The i-type semiconductor layer 31 and the n-type semiconductor layer 32 are formed of, for example, amorphous silicon (a-Si). The p-type semiconductor layer 33 is formed of, for example, polysilicon (p-Si). The material of each of the semiconductor layers is not limited to those mentioned above and may be, for example, polysilicon or microcrystalline silicon.

The a-Si of the n-type semiconductor layer 32 is doped with impurities to form an n+ region. The p-Si of the p-type semiconductor layer 33 is doped with impurities to form a p+ region. The i-type semiconductor layer 31 is, for example, a non-doped intrinsic semiconductor, and has lower conductivity than that of the n-type semiconductor layer 32 and the p-type semiconductor layer 33.

In FIG. 7, a dotted line indicates a first region R1 serving as an effective sensor area in which the p-type semiconductor layer 33 and the i-type semiconductor layer 31 (and the n-type semiconductor layer 32) overlap one another and are directly coupled together. Each of the partial photodiodes 30S includes at least the first region R1. In other words, a plurality (eight in FIG. 7) of the first regions R1 are arranged in a triangular lattice pattern in the plan view. The openings OP1 of the optical filter 7 are provided so as to overlap the first regions R1.

Each of the partial photodiodes 30S is formed in a circular shape or a semi-circular shape in the plan view. The shape of the partial photodiode 30S is, however, not limited thereto, and may be a polygonal shape, for example. The partial photodiodes 30S may also have shapes different from one another.

The n-type semiconductor layers 32 of the partial photodiodes 30S-1, 30S-2, and 30S-3 arranged in the second direction Dy are electrically coupled together through a joint CA1. The p-type semiconductor layers 33 of the partial photodiodes 30S-1, 30S-2, and 30S-3 are electrically coupled together through a joint CA2.

The n-type semiconductor layers 32 (i-type semiconductor layers 31) of the partial photodiodes 30S-4, 30S-5, 30S-6, 30S-7, and 30S-8 are electrically coupled together through a base BA1. The p-type semiconductor layers 33 of the partial photodiodes 30S-4, 30S-5, 30S-6, 30S-7, and 30S-8 are electrically coupled together through a base BA2. The bases BA1 and BA2 are each formed in a substantially pentagonal shape and are provided, in the apex positions thereof, with the partial photodiodes 30S-4, 30S-5, 30S-6, 30S-7, and 30S-8. The bases BA1 and BA2 are not limited to a continuously formed pentagonal shape, and may have other shapes. The bases BA1 and BA2 may be formed in an annular shape without the n-type semiconductor layer 32 and the p-type semiconductor layer 33 being formed in a central portion.

The base BA1 is disposed so as to be separate from the i-type semiconductor layers 31 and the n-type semiconductor layers 32 of the partial photodiodes 30S-1, 30S-2, and 30S-3 in the first direction Dx. In contrast, the base BA2 coupled to the p-type semiconductor layers 33 of the partial photodiodes 30S-4, 30S-5, 30S-6, 30S-7, and 30S-8 is electrically coupled to the p-type semiconductor layers 33 of the partial photodiodes 30S-1, 30S-2, and 30S-3 through a joint CA2a passing below the reset signal line SLrst and the reference signal line SLcom along the first direction Dx. This configuration electrically couples together the partial photodiodes 30S constituting one photodiode 30.

A lower conductive layer 35 is provided in an area overlapping the partial photodiodes 30S, the joints CA1, CA2, and CA2a, and the bases BA1 and BA2. Portions of the lower conductive layer 35 overlapping the partial photodiodes 30S are each formed in a circular shape. However, the portions of the lower conductive layer 35 may each have a different shape from that of the partial photodiode 30S. The lower conductive layer 35 only needs to be provided in portions overlapping at least the first regions R1. The lower conductive layer 35 is supplied with the reference potential VCOM that is the same as the potential of the p-type semiconductor layers 33, which reduces the parasitic capacitance between the lower conductive layer 35 and the p-type semiconductor layers 33.

An upper conductive layer 34 electrically couples together the n-type semiconductor layers 32 of the partial photodiodes 30S. Specifically, the upper conductive layer 34 is electrically coupled to the n-type semiconductor layers 32 of the partial photodiodes 30S-1 and 30S-3 in positions overlapping therewith, through contact holes H1 and H2 provided in an insulating film 27 (refer to FIG. 8). A coupling portion 34a of the upper conductive layer 34 is formed in a T-shape so as to overlap the joints CA1, CA2, CA2a, and the partial photodiode 30S-2 and is coupled to a coupling portion 34b. The coupling portion 34b of the upper conductive layer 34 is electrically coupled to the n-type semiconductor layer 32 of the base BA1 in a position overlapping the base BA1, through a contact hole H3 provided in the insulating film 27 (refer to FIG. 8).

The upper conductive layer 34 further extends from the coupling portion 34b to an area not overlapping the photodiode 30 and is coupled to a coupling portion 34c. The coupling portion 34c of the upper conductive layer 34 is electrically coupled to each of the transistors (reset transistor Mrst and source follower transistor Msf (refer to FIG. 4)) through a contact hole H4. The upper conductive layer 34 may be provided in any manner and may be provided so as to partially cover the partial photodiodes 30S or entirely cover the partial photodiodes 30S, for example.

The reset transistor Mrst, the source follower transistor Msf, and the read transistor Mrd are provided in an area not overlapping the photodiode 30. The source follower transistor Msf and the read transistor Mrd are provided, for example, adjacent in the first direction Dx to the photodiode 30. The reset transistor Mrst is disposed adjacent in the second direction Dy to the partial photodiode 30S-4 and is disposed between the partial photodiode 30S-1 and the partial photodiode 30S-6 in the first direction Dx.

One end of a semiconductor layer 61 of the reset transistor Mrst is coupled to the reset signal line SLrst. The other end of the semiconductor layer 61 is coupled to coupling wiring line SLcn3 (node N1) through a contact hole. A portion of the reset signal line SLrst coupled to the semiconductor layer 61 serves as a source electrode, and a portion of the coupling wiring line SLcn3 coupled to the semiconductor layer 61 serves as a drain electrode 63. The semiconductor layer 61 is formed in a U-shape, and intersects the reset control scan line GLrst at two locations. Channel regions are formed in portions of the semiconductor layer 61 overlapping the reset control scan line GLrst, and portions of the reset control scan line GLrst overlapping the semiconductor layer 61 serve as respective gate electrodes.

The source follower transistor Msf includes a semiconductor layer 65, a source electrode 66, a drain electrode 67, and a gate electrode 68. One end of the semiconductor layer 65 is coupled to the power supply signal line SLsf through a contact hole. The other end of the semiconductor layer 65 is coupled to coupling wiring line SLcn1 (node N2) through a contact hole. A portion of the power supply signal line SLsf coupled to the semiconductor layer 65 serves as the drain electrode 67, and a portion of the coupling wiring line SLcn1 coupled to the semiconductor layer 65 serves as the source electrode 66.

One end side of the gate electrode 68 extends in the first direction Dx and overlaps the semiconductor layer 65. The other end side of the gate electrode 68 extends in the second direction Dy and is electrically coupled to the coupling wiring line SLcn3. This configuration electrically couples the reset transistor Mrst to the gate of the source follower transistor Msf through the coupling wiring line SLcn3.

The read transistor Mrd includes a semiconductor layer 81, a source electrode 82, a drain electrode 83, and the gate electrodes 84. One end of the semiconductor layer 81 is coupled to the coupling wiring line SLcn1 through a contact hole H16 (refer to FIG. 8). The other end of the semiconductor layer 81 is coupled, through a contact hole H15 (refer to FIG. 8), to coupling wiring line SLcn2 that branches in the first direction Dx from the output signal line SL. A portion of the coupling wiring line SLcn1 coupled to the semiconductor layer 81 serves as the drain electrode 83, and a portion of the coupling wiring line SLcn2 coupled to the semiconductor layer 81 serves as the source electrode 82. The two gate electrodes 84 are arranged in the second direction Dy and overlap the semiconductor layer 81. The two gate electrodes 84 are electrically coupled to the read control scan line GLrd through the branch GLrd-a that extends in the second direction Dy and overlaps the power supply signal line SLsf (refer to FIG. 6). With the above-described configuration, the source follower transistor Msf and the read transistor Mrd are coupled to the output signal line SL.

The output signal line SL is disposed between the group of the source follower transistor Msf and the read transistor Mrd and the group of the partial photodiodes 30S-6, 30S-7, and 30S-8. The output signal line SL is provided in a zig-zag manner along the partial photodiodes 30S-6, 30S-7, and 30S-8.

The reset signal line SLrst and the reference signal line SLcom are disposed between the group of the partial photodiodes 30S-1, 30S-2, 30S-3 and the group of the partial photodiodes 30S-4, 30S-5. The reset signal line SLrst and the reference signal line SLcom are provided in a zig-zag manner along the partial photodiodes 30S and intersect the joint CA2*a*. Since the partial photodiodes 30S-1, 30S-2, and 30S-3 are coupled to the partial photodiodes 30S-4 and 30S-5 through the joint CA2*a*, the parasitic capacitance of the reset signal line SLrst and the reference signal line SLcom can be smaller than that of a configuration in which the bases BA1 and BA2 are provided so as to overlap the reset signal line SLrst and the reference signal line SLcom.

The reference signal line SLcom is electrically coupled to the lower conductive layer 35 through a contact hole H11. The reference signal line SLcom is also electrically coupled to the joint CA2 through a contact hole H12. This configuration electrically couples the reference signal line SLcom to the p-type semiconductor layer 33 of each of the partial photodiodes 30S.

In the present embodiment, the partial photodiode 30S is provided for each of the openings OP1 of the optical filter 7. This configuration reduces the size of an area of the photodiode 30, that is, the size of a three-layered area constituting the photodiode 30 in an area not directly irradiated with light, whereby the parasitic capacitance as the photodiode 30 can be reduced. Since the partial photodiodes 30S are scattered in the element, the degree of freedom of arrangement of the transistors and the wiring can be improved, so that the transistors and the wiring are provided as non-overlappingly as possible with the photodiode 30. Consequently, in the present embodiment, the parasitic capacitance of the photodiode 30 can be smaller than that in the case of providing the photodiode 30 so as to overlap the transistors and the wiring.

The planar structure of the photodiode 30 and the transistors illustrated in FIG. 6 is merely an example, and can be changed as appropriate. For example, the number of the partial photodiodes 30S included in each of the photodiodes 30 may be seven or smaller, or nine or larger. The arrangement of the partial photodiodes 30S is not limited to the triangular lattice pattern. The partial photodiodes 30S may be arranged, for example, in a matrix having a row-column configuration.

Figure 8:
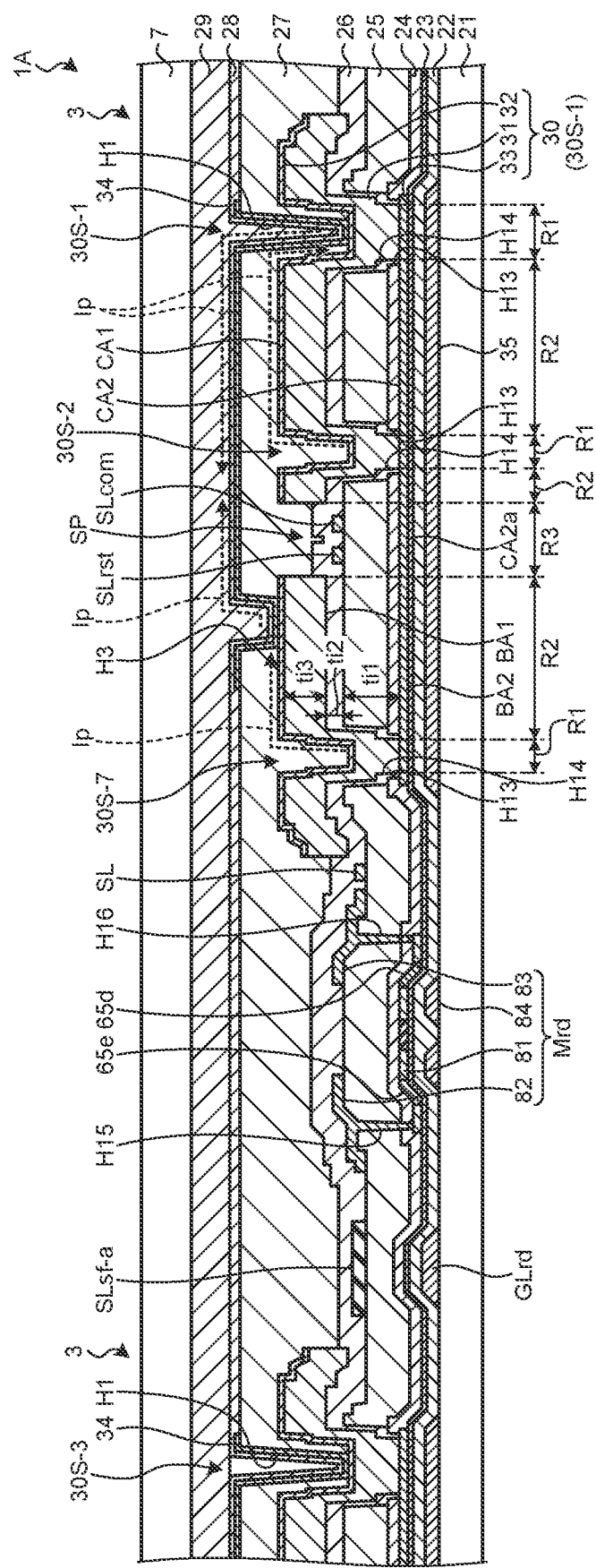
FIG. 8 is an VIII-VIII' sectional view of FIG. 6.

FIG. 8 is an VIII-VIII' sectional view of FIG. 6. FIG. 8 illustrates the sectional configuration of the partial photodiodes 30S-1, 30S-2, and 30S-7, and also the sectional configuration of the read transistor Mrd included in the detection element 3. The source follower transistor Msf and the reset transistor Mrst, which are not illustrated in FIG. 8, have the same sectional configuration as that of the read transistor Mrd.

As illustrated in FIG. 8, the substrate 21 is an insulating substrate and is formed using, for example, a glass substrate of, for example, quartz or alkali-free glass, or a resin substrate of, for example, polyimide. The gate electrodes 84 are provided on the substrate 21. Insulating films 22 and 23 are provided on the substrate 21 so as to cover the gate electrodes 84. The insulating films 22 and 23 and insulating films 24, 25, and 26 are inorganic insulating films and are formed of, for example, a silicon oxide ($SiO_2$) or a silicon nitride (SiN).

The semiconductor layer 81 is provided on the insulating film 23. For example, polysilicon is used as the semiconductor layer 81. The semiconductor layer 81 is, however, not limited thereto and may be formed of, for example, a microcrystalline oxide semiconductor, an amorphous oxide semiconductor, or low-temperature polycrystalline silicon (LTPS). The read transistor Mrd has a bottom-gate structure in which the gate electrodes 84 are provided on the lower side of the semiconductor layer 81. However, the read transistor Mrd may have a top-gate structure in which the gate electrodes 84 are provided on the upper side of the semiconductor layer 81, or a dual-gate structure in which the gate electrodes 84 are provided on the upper side and lower side of the semiconductor layer 81.

The insulating films 24 and 25 are provided on the insulating film 23 so as to cover the semiconductor layer 81. The source electrode 82 and the drain electrode 83 are provided on the insulating film 25. The source electrode 82 is coupled to a high-concentration impurity region of the semiconductor layer 81 through the contact hole H15. The drain electrode 83 is coupled to the high-concentration impurity region of the semiconductor layer 81 through the contact hole H16. The source electrode 82 and the drain electrode 83 are each formed of, for example, a multi-layered film of, for example, Ti—Al—Ti layers or Ti—Al layers having a multi-layered structure of titanium and aluminum.

The following describes the sectional configuration of the photodiode 30. While the partial photodiodes 30S-1, 30S-2, and 30S-7 will be described with reference to FIG. 8, the description of the partial photodiodes 30S-1, 30S-2, and 30S-7 can also be applied to the other partial photodiodes 30S. As illustrated in FIG. 8, the lower conductive layer 35 is provided in a layer that is the same as that of the gate electrodes 84 and is on the substrate 21. The insulating films 22 and 23 are provided on the lower conductive layer 35. The photodiode 30 is provided on the insulating film 23. In other words, the lower conductive layer 35 is provided between the substrate 21 and the p-type semiconductor layer 33. The lower conductive layer 35 is formed of the same material as that of the gate electrodes 84 and thereby serves as a light-blocking layer. Thus, the lower conductive layer 35 can restrain light from entering the photodiode 30 from the substrate 21 side.

The i-type semiconductor layer 31 is provided between the p-type semiconductor layer 33 and the n-type semiconductor layer 32 in the third direction Dz. In the present embodiment, the p-type semiconductor layer 33, the i-type semiconductor layer 31, and the n-type semiconductor layer 32 are stacked on the insulating film 23 in the order as listed.

Specifically, the p-type semiconductor layer 33 is provided in a layer that is the same as that of the semiconductor layer 81 and is on the insulating film 23. The insulating films 24, 25, and 26 are provided so as to cover the p-type semiconductor layer 33. The insulating films 24 and 25 are provided with a contact hole H13 in a position overlapping the p-type semiconductor layer 33. The insulating film 26 is provided on the insulating film 25 and covers side surfaces of the insulating films 24 and 25 constituting an inner wall of the contact hole H13. The insulating film 26 is provided with a contact hole H14 in a position overlapping the p-type semiconductor layer 33.

The i-type semiconductor layer 31 is provided on the insulating film 26 and is coupled to the p-type semiconductor layer 33 through the contact hole H14 passing through the insulating films 24 to 26. The n-type semiconductor layer 32 is provided on the i-type semiconductor layer 31.

In more detail, the photodiode 30 has the first regions R1, second regions R2 and a third region R3. The first regions R1 are provided corresponding to the partial photodiodes 30S. In each of the first regions R1, the p-type semiconductor layer 33, the i-type semiconductor layer 31, and the n-type semiconductor layer 32 are stacked so as to be directly in contact with one another. In other words, the first region R1 is a region defined by a bottom surface of the contact hole H14.

The second regions R2 are provided between the first regions R1. In each of the second regions R2, at least the p-type semiconductor layer 33 and the i-type semiconductor layer 31 are stacked so as to be separate from each other in a direction orthogonal to the substrate 21 (in the third direction Dz). More specifically, the second region R2 includes the insulating films 24, 25, and 26 provided between the p-type semiconductor layer 33 and the i-type semiconductor layer 31. The second region R2 is, however, not limited thereto and may include one or two layers of insulating films, or four or more layers of insulating films between the p-type semiconductor layer 33 and the i-type semiconductor layer 31.

In the second region R2, the thickness of the insulating films 24, 25, and 26 (the total thickness of a thickness ti1 of the insulating films 24 and 25 and a thickness ti2 of the insulating film 26) provided between the p-type semiconductor layer 33 and the i-type semiconductor layer 31 is greater than a thickness ti3 of the i-type semiconductor layer 31. The thickness ti1 of the insulating films 24 and 25 is greater than the thickness ti2 of the insulating film 26. The distance between the p-type semiconductor layer 33 and the n-type semiconductor layer 32 of the second region R2 is longer than the distance between the p-type semiconductor layer 33 and the n-type semiconductor layer 32 of the first region R1. The thickness relation between the i-type semiconductor layer 31 and the insulating films 24, 25, and 26 is not limited to the above-described relation, and a configuration can be employed in which the total thickness of the three layers of the insulating films 24, 25, and 26 is less than the thickness of the i-type semiconductor layer 31. In the second region R2, the insulating films 24, 25, and 26 having a predetermined thickness need to be present between the i-type semiconductor layer 31 (and/or the n-type semiconductor layer 32) and the p-type semiconductor layer 33. However, various thicknesses can be employed as the thickness of the insulating films 24, 25, and 26.

The second regions R2 are provided around the first regions R1 in the plan view and include the joints CA1, CA2 and the bases BA1, BA2. The partial photodiodes 30S-1, 30S-2, and 30S-3 are coupled together through the joint CA1 including the i-type semiconductor layer 31 and the n-type semiconductor layer 32 stacked on the insulating film 26 and the joint CA2 including the p-type semiconductor layer 33 formed on the insulating film 23. In the same manner, the partial photodiodes 30S-4 to 30S-8 are coupled together through the base BA1 including the i-type semiconductor layer 31 and the n-type semiconductor layer 32 stacked on the insulating film 26 and the base BA2 including the p-type semiconductor layer 33 formed on the insulating film 23.

With the configuration describe above, the capacitance per unit area generated between the i-type semiconductor layer 31 and the p-type semiconductor layer 33 in the second region R2 is smaller than the capacitance per unit area generated between the i-type semiconductor layer 31 and the p-type semiconductor layer 33 in the first region R1. Consequently, the capacitor Cs (refer to FIG. 4) of each of the photodiodes 30 of the present embodiment can be reduced in capacitance as compared with a case where the i-type semiconductor layer 31 and the n-type semiconductor layer 32 in the second region R2 are stacked on the p-type semiconductor layer 33 without the insulating films 25 and 26 interposed therebetween in the same manner as in the first region R1. As a result, even under detection conditions where the same light is emitted for the same exposure time T, the signal $\Delta Vn1$ can be increased as represented by Expression (2) given above, and thus, the detection sensitivity of the detection device 1 can be increased. The capacitance generated between the i-type semiconductor layer 31 and the p-type semiconductor layer 33 has been described above. However, in view of the fact that the i-type semiconductor layer 31 directly contacts the n-type semiconductor layer 32, and the p-type semiconductor layer faces the n-type semiconductor layer with the i-type semiconductor layer 31 interposed therebetween, the above description of the capacitance can naturally be replaced with a description of capacitance between the p-type semiconductor layer 33 and the n-type semiconductor layer 32.

In the third region R3, the p-type semiconductor layer 33 is provided, and the i-type semiconductor layer 31 and the n-type semiconductor layer 32 are provided so as not to overlap the p-type semiconductor layer 33. The third region R3 is a region provided with the joint CA2a formed by the p-type semiconductor layer 33 described above. That is, in the third region R3, the adjacent first regions R1 are coupled together at least through the p-type semiconductor layer 33. In the third region R3, the insulating films 24 and 25 are provided on the p-type semiconductor layer 33, and the reset signal line SLrst and the reference signal line SLcom are provided above the insulating films 24 and 25 provided on the p-type semiconductor layer 33. In other words, a gap SP of the i-type semiconductor layer 31 and the n-type semiconductor layer 32 is provided on the reset signal line SLrst and the reference signal line SLcom. Such a configuration can ensure insulation between each of the signal lines and the n-type semiconductor layer 32 as compared with a configuration in which the i-type semiconductor layer 31 and the n-type semiconductor layer 32 are provided so as to overlap the reset signal line SLrst and the reference signal line SLcom.

The insulating film 27 is provided on the insulating film 26 so as to cover the photodiode 30. The insulating film 27 is provided so as to be directly in contact with the photodiode 30 and the insulating film 26. The insulating film 27 is formed of an organic material such as a photosensitive acrylic resin. The insulating film 27 is thicker than the insulating film 26. The thickness relation between these insulating films may be reversed. The insulating film 27 has a better step coverage property than that of inorganic insulating materials and is provided so as to cover side surfaces of the i-type semiconductor layer 31 and the n-type semiconductor layer 32.

The upper conductive layer 34 is provided above the insulating film 27. The upper conductive layer 34 is formed of, for example, a light-transmitting conductive material such as indium tin oxide (ITO). The upper conductive layer 34 is provided along a surface of the insulating film 27 and is coupled to the n-type semiconductor layer 32 through the contact holes H1 and H3 provided in the insulating film 27. With this configuration, signals (photocurrents Ip) output from the respective partial photodiodes 30S are put together in the common upper conductive layer 34 and are output as one detection signal Vdet through the source follower transistor Msf and the read transistor Mrd (refer to FIG. 4).

The contact hole H1 is provided in a position overlapping the first region R1, and the n-type semiconductor layer 32 of the partial photodiode 30S-1 is coupled to the upper conductive layer 34 on a bottom surface of the contact hole H1. Neither of the contact holes H1 and H3 is formed in the first regions R1 of the partial photodiodes 30S-2 and 30S-7. The contact hole H3 is provided in a position overlapping the second region R2. The width of the first region R1 of the partial photodiode 30S-1 is greater than the width of the first region R1 of each of the partial photodiodes 30S-2 and 30S-7. However, since the upper conductive layer 34 only needs to be coupled to the n-type semiconductor layer 32 at any location, the first regions R1 of the partial photodiodes 30S may be formed to have the same width and shape.

An insulating film 28 is provided on the insulating film 27 so as to cover the upper conductive layer 34. The insulating film 28 is an inorganic insulating film. The insulating film 28 is provided as a protective layer for restraining water from entering the photodiode 30.

A protective film 29 is provided on the insulating film 28. The protective film 29 is an organic protective film. The protective film 29 is formed so as to planarize a surface of the detection device 1.

In the present embodiment, the p-type semiconductor layer 33 and the lower conductive layer 35 of the photodiode 30 are provided in the same layers as those of the transistors. Therefore, the manufacturing process can be simpler than in a case where the photodiode 30 is formed in layers different from those of the transistors.

The sectional configuration of the photodiode 30 illustrated in FIG. 8 is merely an example. The sectional configuration is not limited to this example. For example, the photodiode 30 may be provided in layers different from those of the transistors. The stacking order of the p-type semiconductor layer 33, the i-type semiconductor layer 31, and the n-type semiconductor layer 32 is also not limited to that of FIG. 8. The stacking may be made in the order of the n-type semiconductor layer 32, the i-type semiconductor layer 31, and the p-type semiconductor layer 33.

The first shield wiring line SLsf-a is provided in the same layer as that of each of the signal lines (such as the output signal line SL) so as to overlap the read control scan line GLrd. That is, the first shield wiring line SLsf-a is provided on the insulating film 25 and is provided in a layer different from the i-type semiconductor layer 31 and the n-type semiconductor layer 32 of the partial photodiode 30S adjacent thereto. While FIG. 8 does not illustrate the second shield wiring line SLrst-a, the second shield wiring line SLrst-a is also provided in a layer that is the same as that of the first shield wiring line SLsf-a and is on the insulating film 25.

Figure 9:
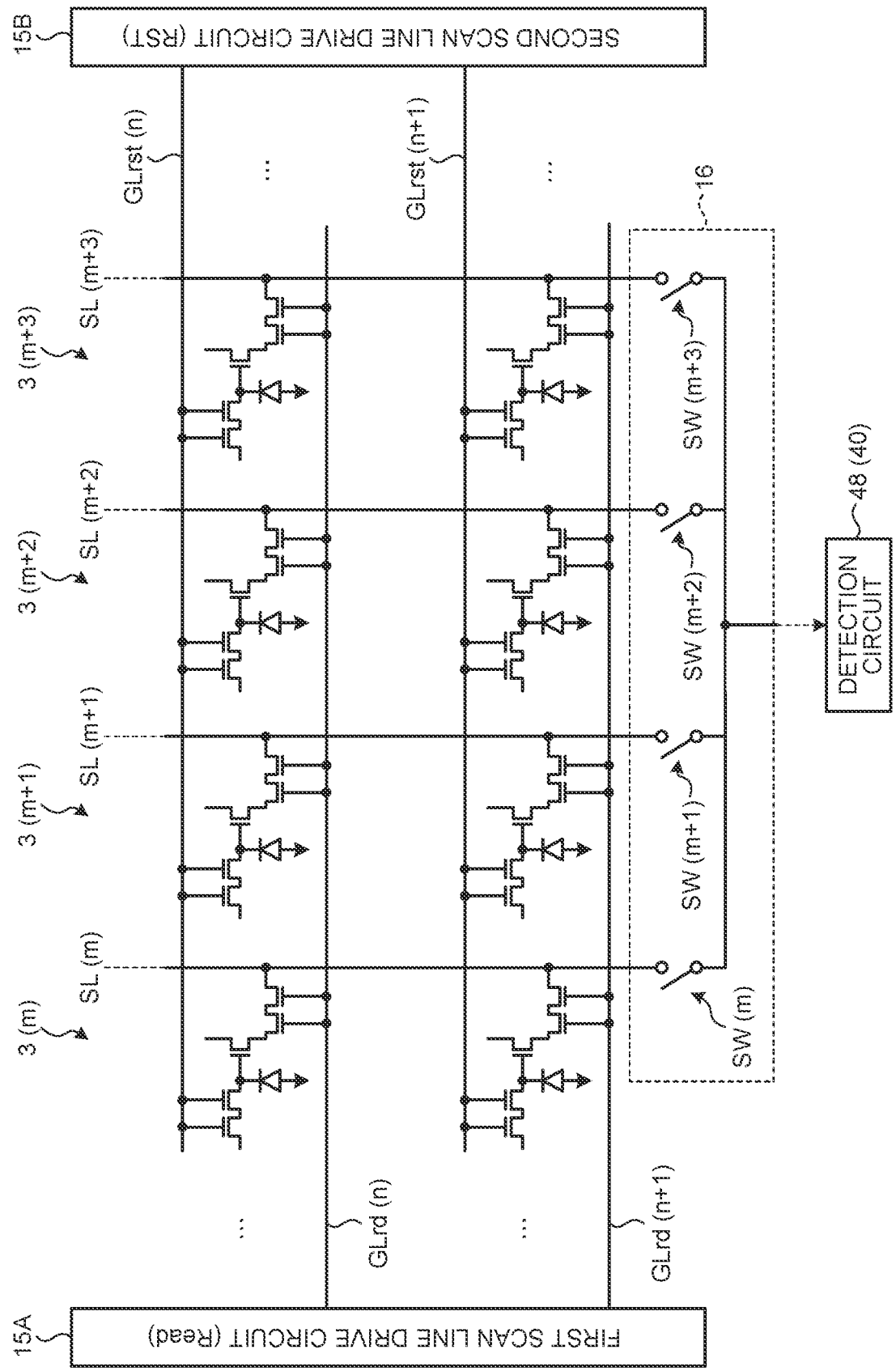
FIG. 9 is a circuit diagram illustrating a coupling relation of the detection elements with scan line drive circuits and a signal line selection circuit of the detection device according to the first embodiment.
Figure 10:
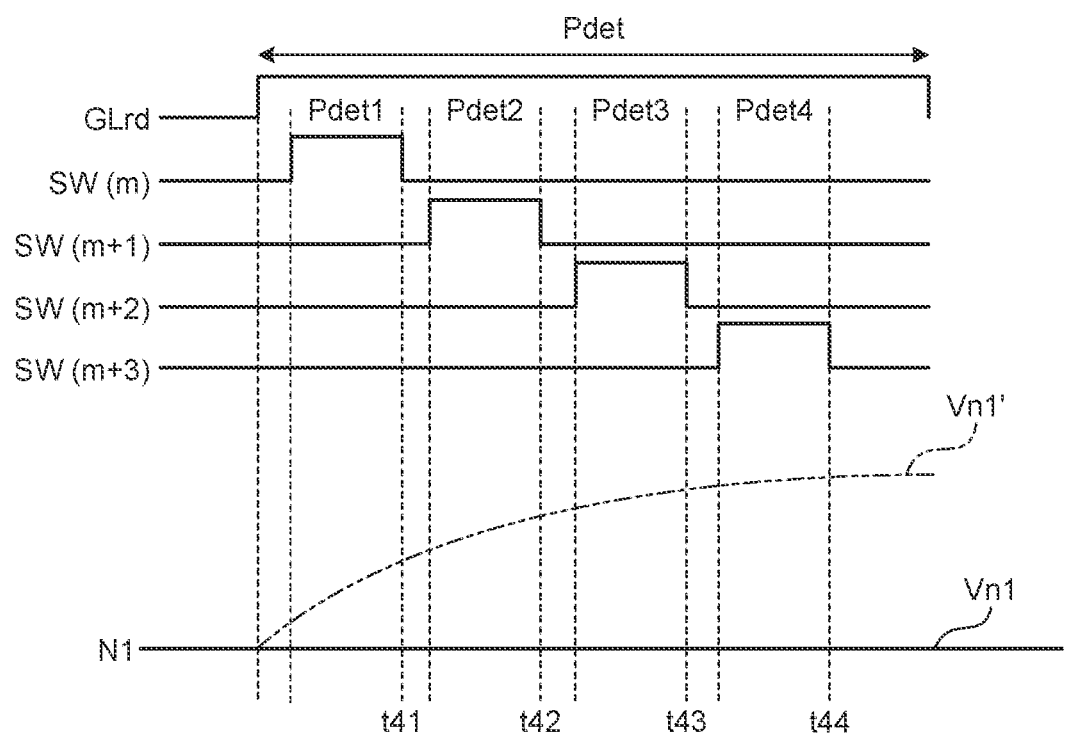
FIG. 10 is a timing waveform diagram illustrating an operation example of the detection elements during a read period.

The following describes the configuration and the operation example of the signal line selection circuit 16. FIG. 9 is a circuit diagram illustrating a coupling relation of the detection elements with the scan line drive circuits and the signal line selection circuit of the detection device according to a first embodiment. FIG. 10 is a timing waveform diagram illustrating an operation example of the detection elements during the read period.

As illustrated in FIG. 9, the detection elements 3 are arranged in the first direction Dx and the second direction Dy. The detection elements 3 arranged in the first direction Dx are denoted as detection elements 3(m), 3(m+1), 3(m+2), and 3(m+3). However, the detection elements 3(m), 3(m+1), 3(m+2), and 3(m+3) will each be simply referred to as the detection element 3 when they need not be distinguished from one another. The output signal lines SL, the read control scan lines GLrd, and the reset control scan lines GLrst are also denoted in a similar manner.

As illustrated in FIG. 9, the detection device 1 includes a first scan line drive circuit 15A and a second scan line drive circuit 15B. The read control scan lines GLrd(n) and GLrd(n+1) are coupled to the first scan line drive circuit 15A. The reset control scan lines GLrst(n) and GLrst(n+1) are coupled to the second scan line drive circuit 15B.

The output signal lines SL(m), SL(m+1), SL(m+2), and SL(m+3) are provided corresponding to the detection elements 3(m), 3(m+1), 3(m+2), and 3(m+3).

The signal line selection circuit 16 includes a plurality of switch elements SW(m), SW(m+1), SW(m+2), and SW(m+3). The switch elements SW(m), SW(m+1), SW(m+2), and SW(m+3) are provided corresponding to the output signal lines SL(m), SL(m+1), SL(m+2), and SL(m+3). Specifically, the switch elements SW(m), SW(m+1), SW(m+2), and SW(m+3) switch between coupling and non-coupling of the output signal lines SL(m), SL(m+1), SL(m+2), and SL(m+3) to the detection circuit 48.

FIG. 10 illustrates the read period Pdet illustrated in FIG. 5 in a magnified manner. For ease of understanding, FIG. 10 schematically illustrates, in an exaggerated manner, potentials Vn1 and Vn1' at the node N1 when each of the detection elements 3 is irradiated with the light L2 having the same intensity.

As illustrated in FIG. 10, the signal line selection circuit 16 sequentially turns on the switch elements SW(m), SW(m+1), SW(m+2), and SW(m+3) (into a coupled state) in a time-division manner based on the selection signal ASW (refer to FIG. 3) from the control circuit 102.

During a read period Pdet1, the switch element SW(m) is turned on to couple the output signal line SL(m) to the detection circuit 48. At time t41, the switch element SW(m) is turned off (into a non-coupled state), and after lapse of a predetermined period, the switch element SW(m+1) is turned on to couple the output signal line SL(m+1) to the detection circuit 48 during a read period Pdet2. At time t42, the switch element SW(m+1) is turned off, and after lapse of the predetermined period, the switch element SW(m+2) is turned on to couple the output signal line SL(m+2) to the detection circuit 48 during a read period Pdet3. At time t43, the switch element SW(m+2) is turned off, and after lapse of the predetermined period, the switch element SW(m+3) is turned on to couple the output signal line SL(m+3) to the detection circuit 48 during a read period Pdet4. At time t44, the switch element SW(m+3) is turned off to end the reading of the detection signals Vdet of the detection elements 3($m$) to 3($m$+3).

As described above, the detection device 1 of the present embodiment is provided with the shield wiring line (first shield wiring line SLsf-a and second shield wiring line SLrst-a), and thus, the parasitic capacitance C1 (refer to FIG. 4) is reduced. This configuration reduces the time-dependent change of the potential Vn1' at the node N1 (indicated by a long dashed double-short dashed line in FIG. 10) that would be caused when the shield wiring line is not provided and the parasitic capacitance C1 is generated. Thus, the potential Vn1 at the node N1 ideally exhibits a constant value at times t41, t42, t43, and t44.

Therefore, in the present embodiment, even if the operation of the signal line selection circuit 16 causes a deviation in timing of the reading of the detector elements 3, the variation of the potential that would be caused by the parasitic capacitance C1 can be reduced whereby the detection accuracy can be improved.

As described above, the detection device 1 of the present embodiment includes the substrate 21 (array substrate 2), the transistors (such as the reset transistor Mrst, the read transistor Mrd, and the source follower transistor Msf) provided on the substrate 21, the scan lines (such as the read control scan line GLrd) extending in the first direction Dx, the signal lines (such as the power supply signal line SLsf, the output signal line SL, the reset signal line SLrst, and the reference signal line SLcom) extending in the second direction Dy intersecting the first direction Dx, the photodiodes 30 each provided in the area surrounded by the scan lines and the signal lines, and each including the p-type semiconductor layer 33, the i-type semiconductor layer 31, and the n-type semiconductor layer 32, and the shield wiring line (the first shield wiring line SLsf-a and the second shield wiring line SLrst-a) extending in the first direction Dx so as to overlap the scan line. The shield wiring line is electrically coupled to the power supply signal line SLsf among the signal lines that supplies the power supply potential to the transistors.

This configuration can reduce the parasitic capacitance C1 (refer to FIG. 4) that would be generated between the read control scan line GLrd and the photodiodes 30 (partial photodiodes 30S). As a result, the detection sensitivity of the detection device 1 can be improved as represented by Expression (2) given above. The parasitic capacitance C1 that would be generated between the read control scan line GLrd and the partial photodiodes 30S located close thereto is effectively reduced. As a result, the variation in the parasitic capacitance C1 that would be caused by the variation in arrangement relation of the partial photodiodes 30S can be restrained. Therefore, the detection variation of the detection device 1 can be reduced.

Second Embodiment

Figure 11:
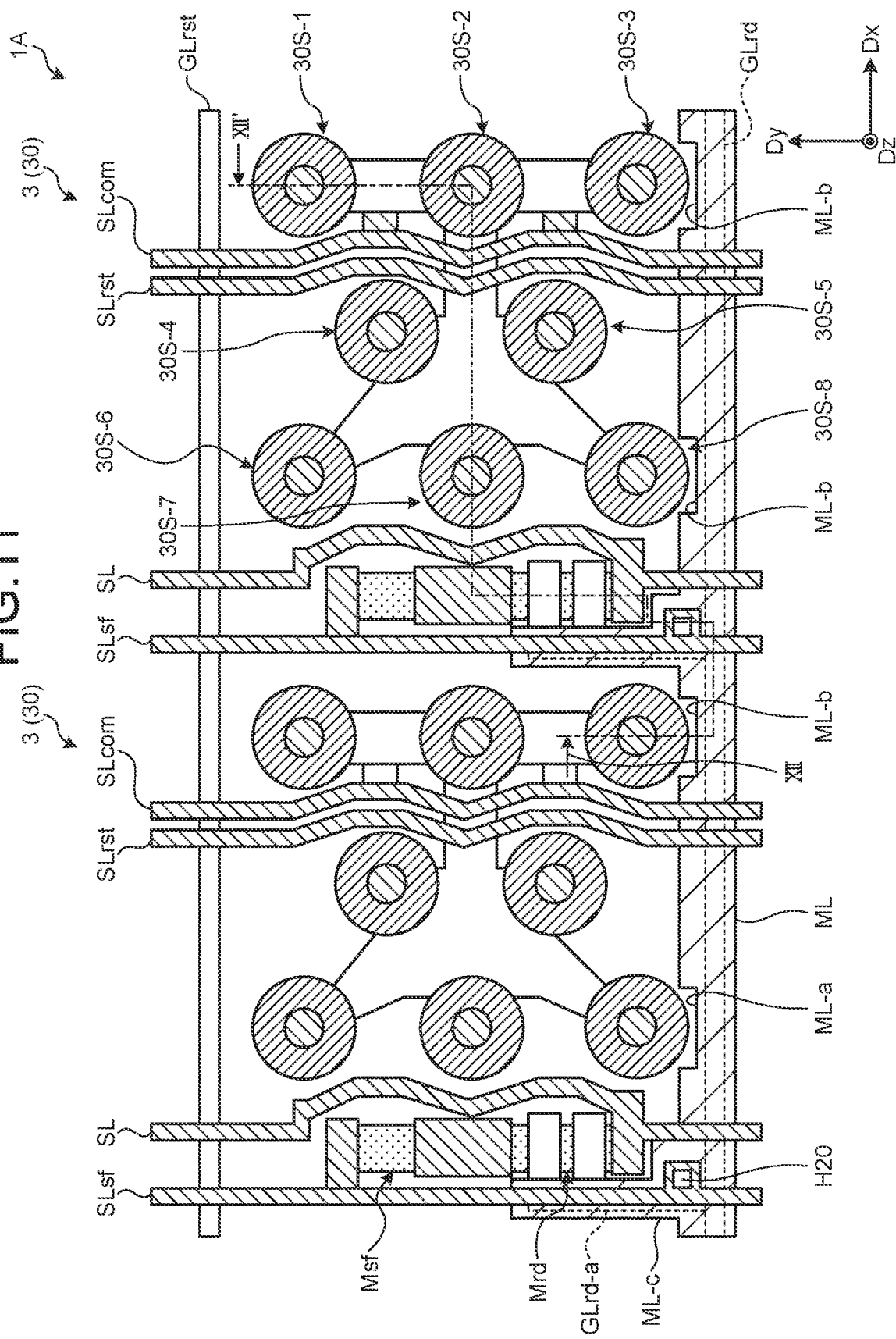
FIG. 11 is a plan view illustrating the detection elements according to a second embodiment.
Figure 12:
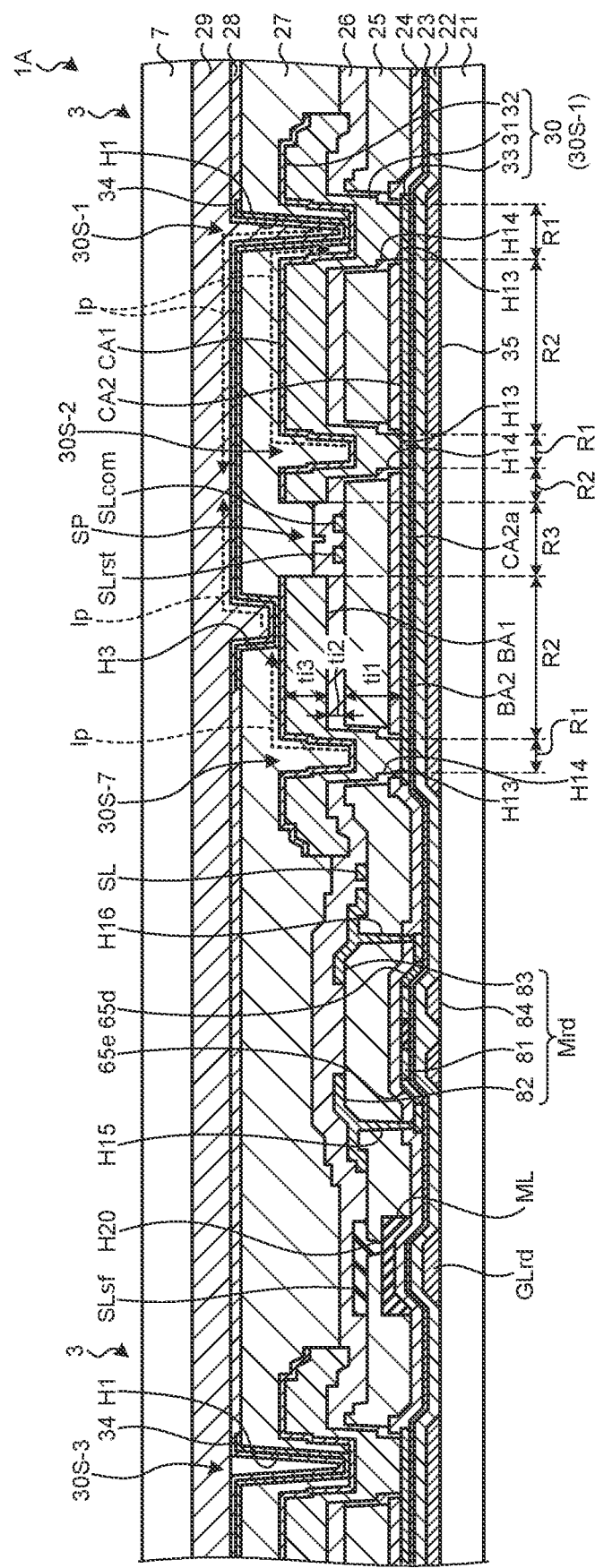
FIG. 12 is a XII-XII' sectional view of FIG. 11.
Figure 13:
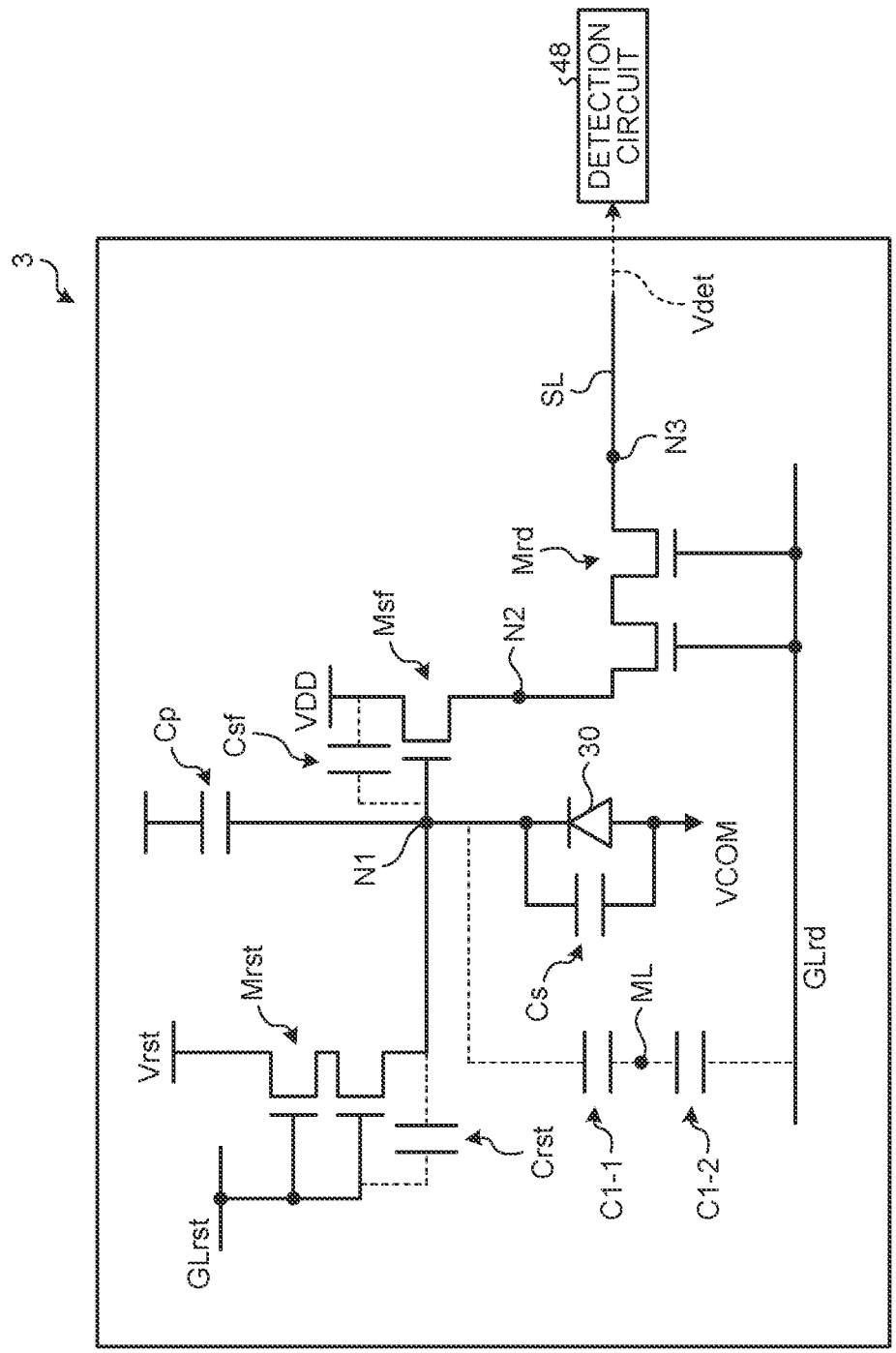
FIG. 13 is a circuit diagram illustrating the detection device according to the second embodiment.

FIG. 11 is a plan view illustrating the detection elements according to a second embodiment. FIG. 12 is a XII-XII' sectional view of FIG. 11. FIG. 13 is a circuit diagram illustrating the detection device according to the second embodiment. In the following description, the same components as those described in the embodiment describe above are denoted by the same reference numerals and will not be described again.

In the first embodiment, the configuration has been described in which the shield wiring lines (first shield wiring line SLsf-a and second shield wiring line SLrst-a) is provided in the same layer as that of the signal lines. However, the shield wiring lines may be provided in a different layer from that of the signal lines.

As illustrated in FIG. 11, in a detection device 1A according to the second embodiment, a shield wiring line ML is formed of a metal layer provided in a different layer from that of the signal lines (power supply signal line SLsf, output signal line SL, reset signal line SLrst, and reference signal line SLcom). The shield wiring line ML extends in the first direction Dx so as to overlap the read control scan line GLrd and is provided so as to intersect the signal lines (the power supply signal line SLsf, the output signal line SL, the reset signal line SLrst, and the reference signal line SLcom) arranged in the first direction Dx. The shield wiring line ML is electrically coupled to the power supply signal line SLsf through a contact hole H20.

The shield wiring line ML has a greater width in the second direction Dy than that of the read control scan line GLrd in the same manner as in the first embodiment and has recesses ML-a and ML-b formed thereon in areas adjacent to the partial photodiodes 30S. The shield wiring line ML has a shield wiring branch ML-c that extends in the second direction Dy so as to overlap the branch GLrd-a of the read control scan line GLrd.

The shield wiring line ML is continuously provided over the detection elements 3 (photodiodes 30) arranged in the first direction Dx. However, the shield wiring line ML is not limited thereto and may be provided with slits and be separate for each of the detection elements 3.

As illustrated in FIG. 12, the shield wiring line ML is provided between the layer provided with the read control scan line GLrd and the layer provided with the signal lines (such as the power supply signal line SLsf). In more detail, the shield wiring line ML is provided on the insulating film 24 and is provided in a layer closer to the i-type semiconductor layer 31 and the n-type semiconductor layer 32 than the layer provided with the p-type semiconductor layer 33. The insulating film 25 is provided between the shield wiring line ML and the power supply signal line SLsf. The shield wiring line ML is electrically coupled to the power supply signal line SLsf through the contact hole H20 provided in the insulating film 25.

In the second embodiment, the shield wiring line ML is provided in a layer closer to the read control scan line GLrd than in the first embodiment described above. This configuration allows the shield wiring line ML to effectively block fringe components of an electric field and thus to reduce the parasitic capacitance C1.

As illustrated in FIG. 13, parasitic capacitance C1-1 is generated between the shield wiring line ML and the node N1 (the cathode (n-type semiconductor layer 32) of the photodiode 30). In addition, parasitic capacitance C1-2 is generated between the shield wiring line ML and the read control scan line GLrd. The node N1 is capacitively coupled to the read control scan line GLrd through the shield wiring line ML. Therefore, even when the read control signal RD is supplied to the read control scan line GLrd and the potential of the read control scan line GLrd changes, the potential of the node N1 (cathode of the photodiode 30) is restrained from changing because the shield wiring line ML is coupled to the fixed potential (power supply potential VDD). The description of the capacitive coupling of the node N1 to the read control scan line GLrd illustrated in FIG. 13 is also applicable to the first embodiment described above.

While the preferred embodiments of the present disclosure have been described above, the present disclosure is not limited to the embodiments described above. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiments and the modifications described above.

What is claimed is:

1. A detection device comprising:
   a substrate;
   a plurality of transistors provided on the substrate;
   a plurality of scan lines that extend in a first direction;
   a plurality of signal lines that extend in a second direction intersecting the first direction;
   a plurality of photodiodes that are provided in an area surrounded by the scan lines and the signal lines and each include a p-type semiconductor layer, an i-type semiconductor layer, and an n-type semiconductor layer; and
   a shield wiring line that extends in the first direction and overlaps a corresponding one of the scan lines, wherein
   the shield wiring line is electrically coupled to, among the signal lines, a power supply signal line configured to supply a power supply potential to the transistors.

2. The detection device according to claim 1, wherein the shield wiring line is provided in the same layer as that of the signal lines.

3. The detection device according to claim 1, wherein
   the signal lines include a reset signal line configured to supply a reset signal to the photodiodes,
   the shield wiring line includes a first shield wiring line and a second shield wiring line,
   the first shield wiring line is coupled to the power supply signal line and extends in a direction intersecting the power supply signal line, and
   the second shield wiring line is coupled to the reset signal line and extends in a direction intersecting the reset signal line.

4. The detection device according to claim 3, wherein
   the signal lines include an output signal line configured to output a signal from the photodiodes, and
   the output signal line is provided between the first shield wiring line and the second shield wiring line in the first direction while being separate from the first shield wiring line and the second shield wiring line.

5. The detection device according to claim 1, wherein the shield wiring line is formed of a metal layer provided between a layer of the scan lines and a layer of the signal lines.

6. The detection device according to claim 5, further comprising an insulating film provided between the shield wiring line and the power supply signal line, wherein the shield wiring line is electrically coupled to the power supply signal line through a contact hole provided in the insulating film.

7. The detection device according to claim 5, wherein the shield wiring line extends in the first direction, overlaps the corresponding one of the scan lines in a plan view, and intersects the signal lines.

8. The detection device according to claim 1, wherein the shield wiring line has a greater width in the second direction than that of the scan lines and has a recess in a width direction adjacent to the photodiodes in a plan view.

9. The detection device according to claim 1, wherein
   the signal lines include output signal lines configured to output signals from the photodiodes,
   the detection device comprises a signal line selection circuit, and
   the signal line selection circuit comprises a plurality of switch elements corresponding to the output signal lines and is configured to switch coupling between the output signal lines and a detection circuit using the switch elements.

10. The detection device according to claim 1, wherein each of the photodiodes comprises:
    a plurality of first regions in which the p-type semiconductor layer, the i-type semiconductor layer, and the n-type semiconductor layer are stacked directly and are in contact with one another; and
    a second region in which at least the p-type semiconductor layer and the i-type semiconductor layer are stacked and are separate from each other, and
    the first regions adjacent to each other are coupled together at least through the p-type semiconductor layer.

11. The detection device according to claim 10, wherein the p-type semiconductor layer is provided in the same layer as semiconductor layers of the transistors.

12. The detection device according to claim 10, wherein the first regions are arranged in a triangular lattice pattern in a plan view when viewed from a direction orthogonal to the substrate.

13. A detection device comprising:
    a substrate;
    a plurality of transistors provided on the substrate;
    a plurality of scan lines that extend in a first direction;
    a power supply signal line that extends in a second direction intersecting the first direction and that is configured to supply a power supply potential to the plurality of transistors;
    a plurality of photodiodes that are provided in an area, between two of the plurality of scan lines, the two being adjacent to each other, and each include a p-type semiconductor layer, an i-type semiconductor layer, and an n-type semiconductor layer; and
    a shield wiring line that extends in the first direction so as to overlap a corresponding one of the scan lines and is configured to be supplied with the power supply potential.

14. The detection device according to claim 13, wherein the shield wiring line is coupled to the power supply signal line.

* * * * *